(12) United States Patent
Kodani

(10) Patent No.: US 9,818,702 B2
(45) Date of Patent: Nov. 14, 2017

(54) WIRING SUBSTRATE AND SEMICONDUCTOR DEVICE

(71) Applicant: SHINKO ELECTRIC INDUSTRIES CO., LTD., Nagano-ken (JP)

(72) Inventor: Kotaro Kodani, Nagano (JP)

(73) Assignee: SHINKO ELECTRIC INDUSTRIES, CO., LTD. (JP)

( * ) Notice: Subject to any disclaimer, the term of this patent is extended or adjusted under 35 U.S.C. 154(b) by 0 days.

(21) Appl. No.: 15/183,273

(22) Filed: Jun. 15, 2016

(65) Prior Publication Data
US 2016/0379938 A1 Dec. 29, 2016

(30) Foreign Application Priority Data

Jun. 26, 2015 (JP) .................................. 2015-128756

(51) Int. Cl.
*H01L 23/00* (2006.01)
*H01L 23/498* (2006.01)

(52) U.S. Cl.
CPC ...... *H01L 23/562* (2013.01); *H01L 23/49822* (2013.01); *H01L 23/49827* (2013.01); *H01L 23/49838* (2013.01); *H01L 2224/16235* (2013.01); *H01L 2224/32225* (2013.01); *H01L 2224/73204* (2013.01); *H01L 2224/92125* (2013.01); *H01L 2224/97* (2013.01); *H01L 2924/15313* (2013.01); *H01L 2924/3511* (2013.01); *H01L 2924/3512* (2013.01)

(58) Field of Classification Search
CPC ......... H01L 23/49822; H01L 23/49827; H01L 23/49838; H01L 23/562; H01L 2224/97; H01L 2224/81; H01L 2224/83; H01L 2224/16235; H01L 2224/32225; H01L 2224/73204; H01L 2224/92125; H01L 2924/15313; H01L 2924/3511; H01L 2924/351
See application file for complete search history.

(56) References Cited

U.S. PATENT DOCUMENTS 8,138,424 B2 * 3/2012 Shimizu .............. H01L 21/6835
174/255
2014/0097009 A1 * 4/2014 Kaneko ............. H01L 23/49822
174/258

FOREIGN PATENT DOCUMENTS

JP 2009-141121 A 6/2009

* cited by examiner

*Primary Examiner* — Marcos D Pizarro
*Assistant Examiner* — Benjamin Tzu-Hung Liu
(74) *Attorney, Agent, or Firm* — Tarolli, Sundheim, Covell & Tummino LLP

(57) ABSTRACT

A wiring substrate includes a first reinforcement pattern stacked on a lower surface of a first insulation layer at a peripheral region located at an outer side of a wiring formation region. A first reinforcement via extends through a second insulation layer in the thickness-wise direction and contacts the first reinforcement pattern. A second reinforcement pattern is stacked on a lower surface of the second insulation layer and connected to the first reinforcement pattern by the first reinforcement via. The first reinforcement via includes a top that partially extends into the first insulation layer.

20 Claims, 14 Drawing Sheets

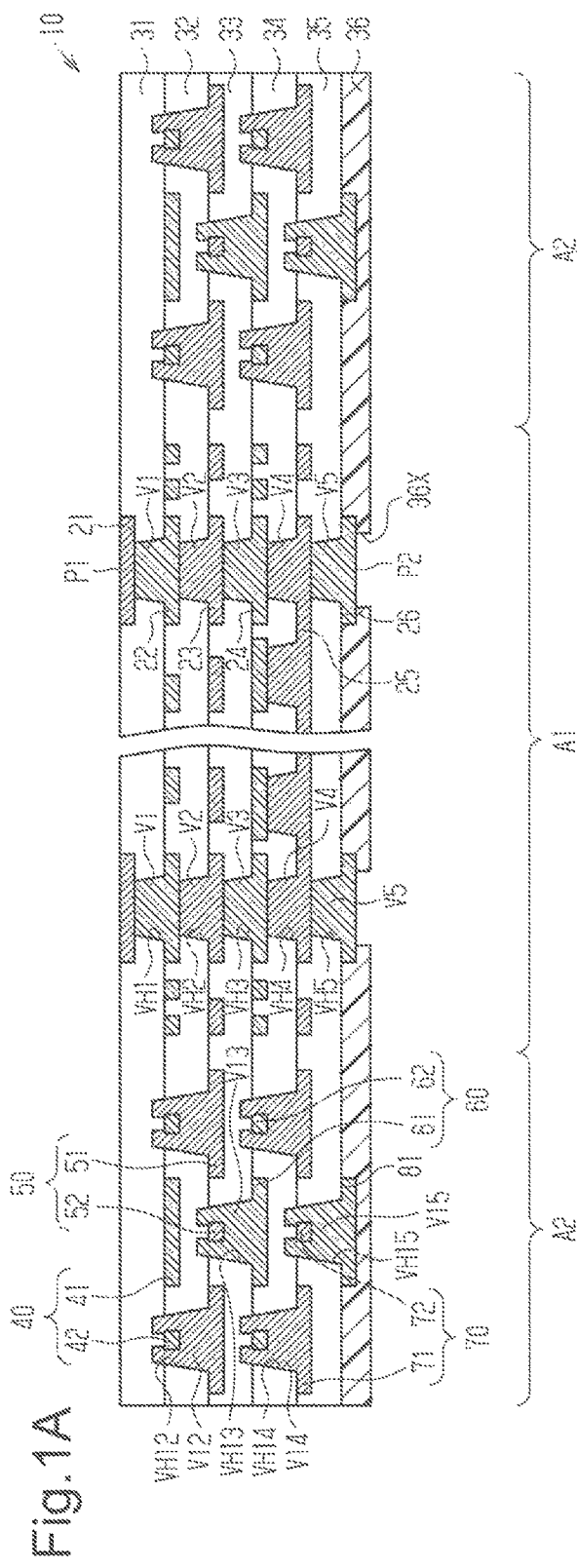
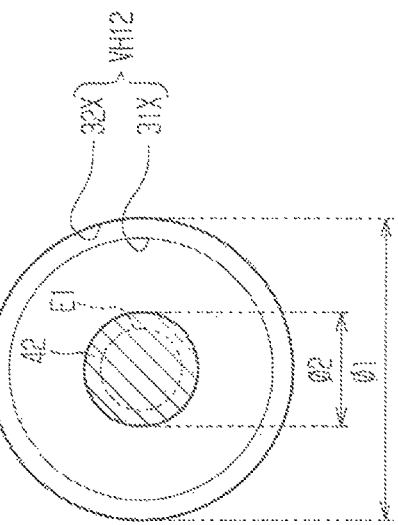
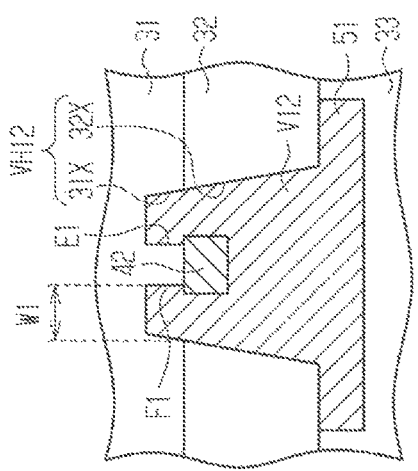
Fig.1A
Fig.1B
Fig.1C

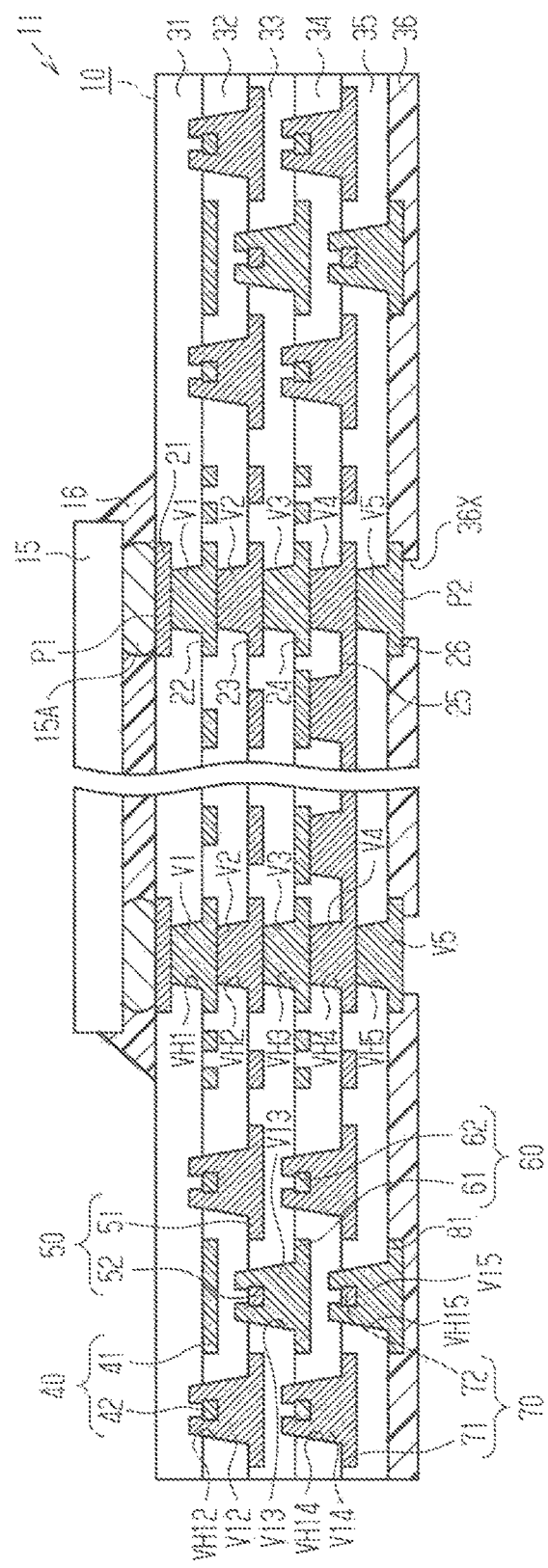

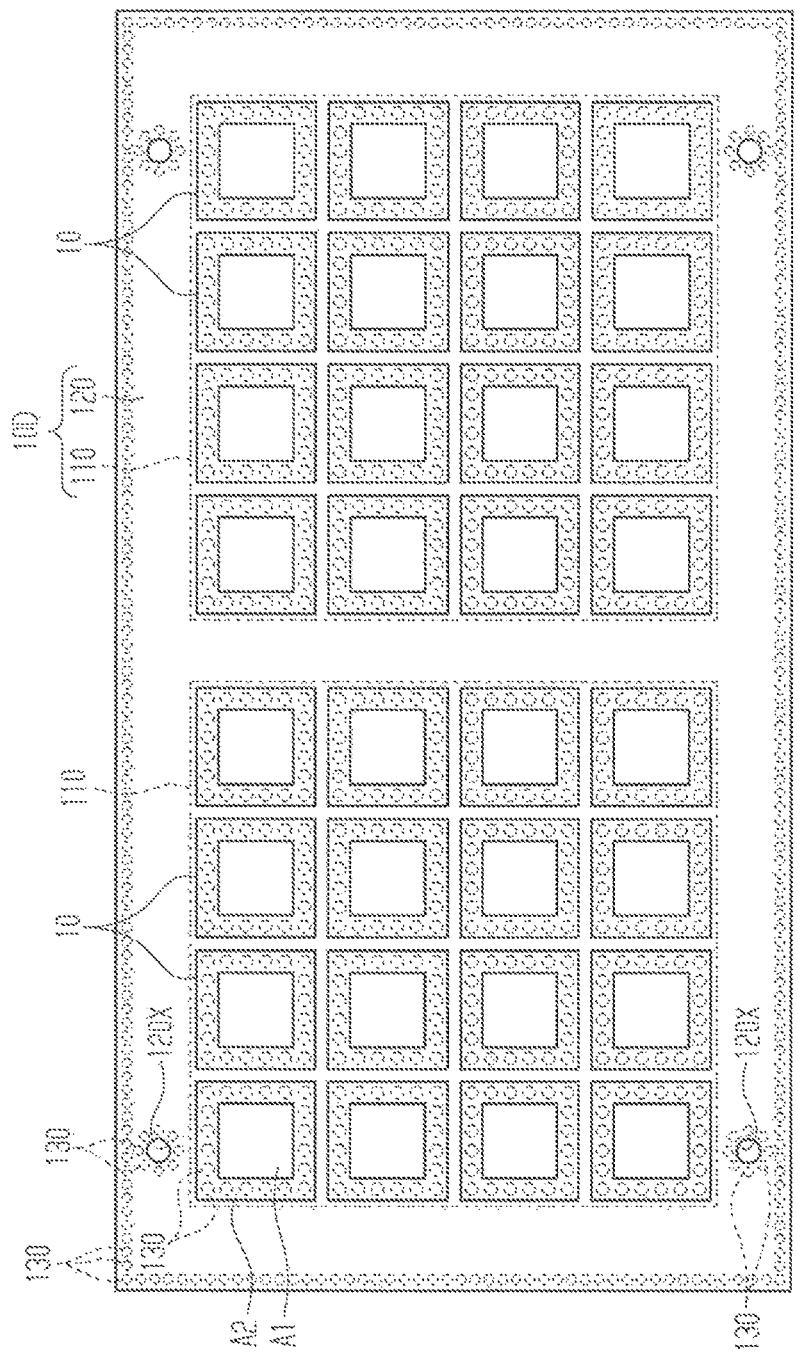
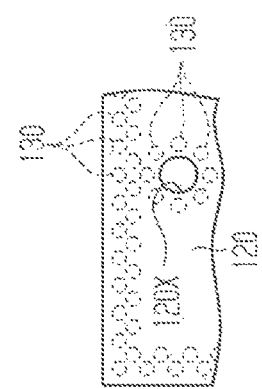
Fig.15A
Fig.15B

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-128756, filed on 26 Jun. 2015, the entire contents of which are incorporated herein by reference.

FIELD

This disclosure relates to a wiring substrate, a semiconductor device, and a method for manufacturing a wiring substrate.

BACKGROUND

Electronic components such as semiconductor elements are mounted on a wiring substrate. A buildup wiring substrate is used to increase the density of wiring patterns in such a wiring substrate. The buildup wiring substrate is obtained through a buildup process that alternately stacks wiring layers and insulation layers.

Japanese Patent No. 4993739 describes one example of a buildup wiring substrate. The wiring substrate includes a wiring formation region and a peripheral region. Wiring layers and insulation layers are alternately stacked in the wiring formation region. The peripheral region surrounds the wiring formation region and includes reinforcement patterns and reinforcement posts. The reinforcement patterns are located in different layers and continuously extend along each side of the wiring substrate. The reinforcement posts are embedded in the insulation layers between the reinforcement patterns.

FIG. 16 illustrates a wiring substrate 200 of the related art. The wiring substrate 200 includes insulation layers 201, 204, and 207, reinforcement posts 202, 205, and 208, and reinforcement patterns 203, 206, and 209. The reinforcement posts 202, 205, and 208 and the reinforcement patterns 203, 206, and 209 are located in the peripheral region of the wiring substrate 200. The reinforcement posts 202, 205, and 208 are formed in the insulation layers 201, 204, and 207, respectively. The reinforcement patterns 203, 206, and 209 are arranged on the lower surfaces of the insulation layers 201, 204, and 207, respectively. The reinforcement pattern 203 continuously extends along a plane parallel to the lower surface of the insulation layer 201 to connect the reinforcement posts 202 to one another. The insulation layer 204 is stacked on the lower surface of the insulation layer 201, and the reinforcement pattern 206 continuously extends along a plane parallel to the lower surface of the insulation layer 204 to connect the reinforcement posts 205 to one another. In the same manner, the insulation layer 207 is stacked on the lower surface of the insulation layer 204, and the reinforcement pattern 209 continuously extends along a plane parallel to the lower surface of the insulation layer 207 to connect the reinforcement posts 208 to one another. In this configuration, the reinforcement patterns 203, 206, and 209 and the reinforcement posts 202, 205, and 208 increase the rigidity of the wiring substrate 200 and reduce warping of the wiring substrate 200.

In the wiring substrate 200, the reinforcement patterns 203, 206, and 209 (e.g., copper) have a coefficient of thermal expansion that differs from that of the insulation layers 201, 204, and 207 (resin). Stress resulting from the difference in the coefficient of thermal expansion (thermal stress) or an impact applied from the outside may inflict damage, such as cracking, to the insulation layers 201, 204, and 207 that have a low strength. Such damage is apt to advance at the interfaces of the reinforcement patterns 203, 206, and 209 and the insulation layers 201, 204, and 207. As a result, damage such as cracking occurs continuously along each side of the wiring substrate 200, and the insulation layers 201, 204, and 207 have a tendency to delaminate more easily from the reinforcement patterns 203, 206, and 209.

SUMMARY

One embodiment of this disclosure is a wiring substrate including a first insulation layer. A first wiring layer is stacked on a lower surface of the first insulation layer. A first reinforcement pattern is stacked on the lower surface of the first insulation layer at a peripheral region located at an outer side of a wiring formation region where the first wiring layer is formed. A second insulation layer is stacked on the lower surface of the first insulation layer. The second insulation layer covers the first wiring layer. A first reinforcement via extends through the second insulation layer in a thicknesswise direction and contacts the first reinforcement pattern. A second reinforcement pattern is stacked on a lower surface of the second insulation layer. The second reinforcement pattern is connected to the first reinforcement pattern by the first reinforcement via. The first reinforcement via includes a top that partially extends into the first insulation layer.

Other embodiments and advantages thereof will become apparent from the following description, taken in conjunction with the accompanying drawings, illustrating by way of example the principles of this enclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating a wiring substrate in a first embodiment;

FIG. 1B is a partial, enlarged cross-sectional view of the wiring substrate of FIG. 1A;

FIG. 1C is a schematic plan view illustrating a reinforcement pattern and a via hole in the first embodiment;

FIG. 3 is a schematic cross-sectional view illustrating a semiconductor device including the wiring substrate of FIG. 1A;

FIG. 15A is a schematic plan view illustrating a modified example of the wiring substrate;

FIG. 15B is a partial, enlarged plan view of the wiring substrate illustrated in FIG. 15A.

DESCRIPTION OF THE EMBODIMENTS

Figure 2:
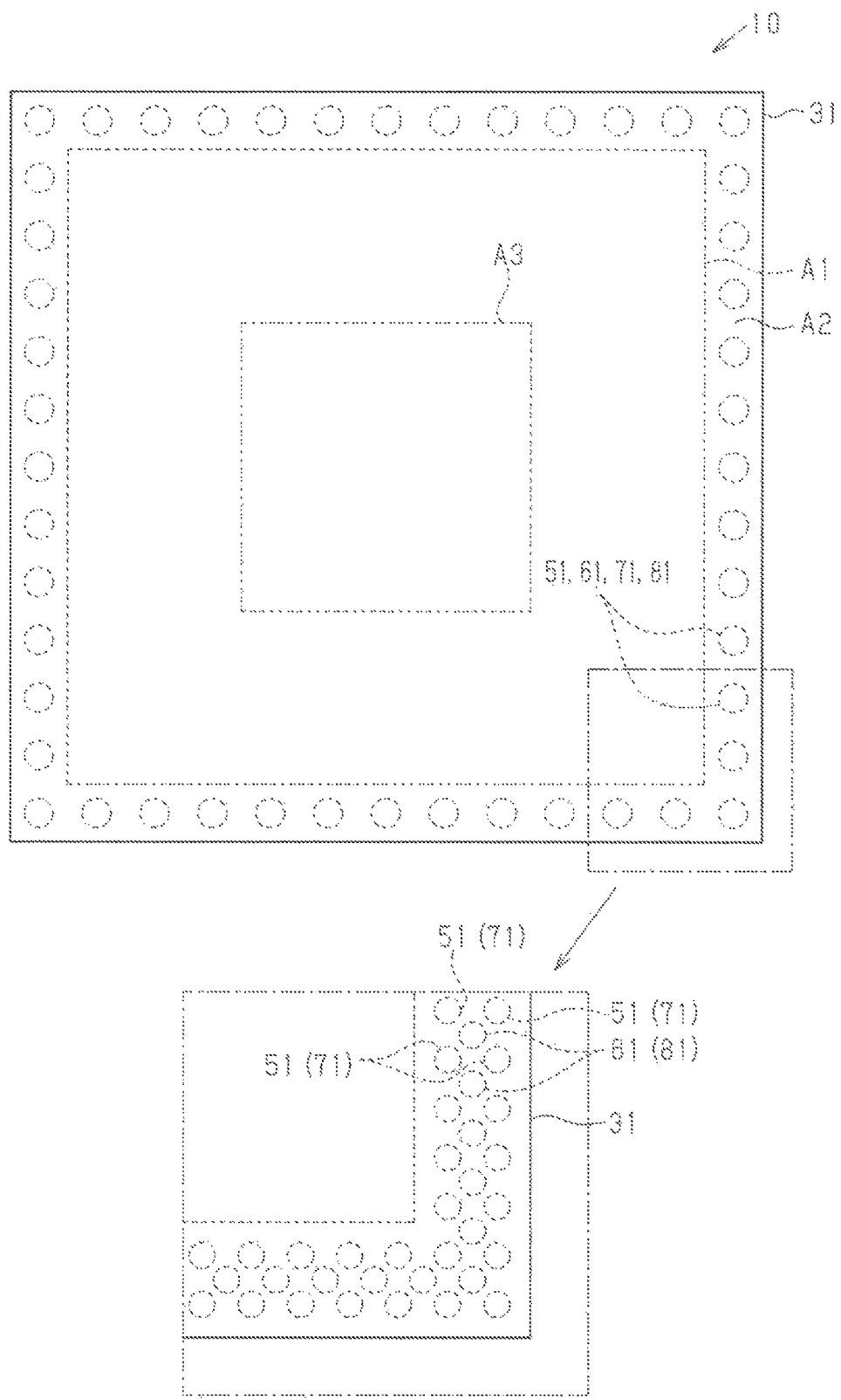
FIG. 2 is a schematic plan view illustrating the wiring substrate of FIG. 1A.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings.

First Embodiment

A first embodiment of a wiring substrate 10 will now be described with reference to FIGS. 1A to 7B. In the present specification, "planar view" refers to the view of a subject taken in a vertical direction (thickness-wise direction of wiring substrate 10) of FIG. 1A, and "planar shape" refers to the shape of a subject as viewed in the vertical direction of FIG. 1A.

Referring to FIG. 2, the wiring substrate 10 is, for example, rectangular in a plan view. The wiring substrate 10 includes a wiring formation region A1, which is defined by the generally central portion of the wiring substrate 10 in a plan view, and a peripheral region A2, which surrounds the wiring formation region A1. The wiring formation region A1 is, for example, rectangular in a plan view. For example, the central portion of the wiring formation region A1 defines a mounting region A3, on which a semiconductor chip 15 (refer to FIG. 3) is mounted. The peripheral region A2, which surrounds the wiring formation region A1, is frame-shaped in a plan view. In the present specification, the phrase "rectangular in a plan view" includes not only a rectangle in strict terms but also a generally rectangular shape.

As illustrated in FIG. 1A, the wiring substrate 10 in the wiring formation region A1 includes a structure obtained by sequentially stacking a wiring layer 21, an insulation layer 31, a wiring layer 22, an insulation layer 32, a wiring layer 23, an insulation layer 33, a wiring layer 24, an insulation layer 34, a wiring layer 25, an insulation layer 35, and a wiring layer 26. In the present embodiment, the wiring substrate 10 is a coreless wiring substrate that does not include a core substrate, which would serve as a support substrate. The coreless wiring substrate differs from a wiring substrate formed by sequentially stacking a given number of build-up layers on one surface or both surfaces of a core substrate (support substrate) through a typical build-up process.

The wiring layers 22 to 26 may be formed from, for example, copper (Cu) or a copper alloy. The material of the insulation layers 31 to 35 may be, for example, an insulative resin such as an epoxy resin or a polyimide resin or a resin material obtained by mixing such insulative resins with a filler such as silica or alumina. Alternatively, the insulation layers 31 to 35 may be formed from a thermosetting insulative resin or a photosensitive insulative resin. Further, the material of the insulation layers 31 to 35 may be an insulative resin containing a reinforcement material by impregnating the reinforcement material, such as a woven cloth or non-woven cloth of glass, aramid, or liquid crystal polymer (LCP) fibers, with an epoxy or polyimide thermosetting resin.

The wiring layer 21 is the outermost layer (here, uppermost layer) of the wiring substrate 10. The insulation layer 31 covers the lower surface and side surfaces of the wiring layer 21 and exposes the upper surface of the wiring layer 21. Portions of the upper surface of the wiring layer 21 exposed in the insulation layer 31 function as connection pads P1 electrically connected to, for example, the semiconductor chip 15 (refer to FIG. 3). In the present embodiment, the surface of the wiring substrate 10 where the connection pads P1 are formed defines a chip mounting surface. For example, the upper surface of the wiring layer 21 is generally flush with the upper surface of the insulation layer 31. The upper surface of the wiring layer 21 may be located at a position lower than the upper surface of the insulation layer 31.

The wiring layer 21 may be, for example, a dual-layer structure including a first conductive layer and a second conductive layer. The first conductive layer is, for example, a Cu layer. The second conductive layer is, for example, a metal layer obtained by sequentially stacking a nickel (Ni) layer and a gold (Au) layer. In this case, the Au layer of the wiring layer 21 is exposed in the insulation layer 31. Another example of the second conductive layer is a metal layer obtained by sequentially stacking an Ni layer, a palladium layer (Pd), and an Au layer. Alternatively, the wiring layer 21 may be, for example, a single layer (e.g., only Cu layer).

The wiring layer 22 is stacked on the lower surface of the insulation layer 31. Via holes VH1 extend through the insulation layer 31 in the thickness-wise direction. The via holes VH1 are filled with via wirings V1 that electrically connect the wiring layer 22 to the wiring layer 21. The wiring layer 23 is stacked on the lower surface of the insulation layer 32. Via holes VH2 extend through the insulation layer 32 in the thickness-wise direction. The via holes VH2 are filled with via wirings V2 that electrically connect the wiring layer 23 to the wiring layer 22. The wiring layer 24 is stacked on the lower surface of the insulation layer 33. Via holes VH3 extend through the insulation layer 33 in the thickness-wise direction. The via holes VH3 are filled with via wirings V3 that electrically connect the wiring layer 24 to the wiring layer 23. The wiring layer 25 is stacked on the lower surface of the insulation layer 34. Via holes VH4 extend through the insulation layer 34 in the thickness-wise direction. The via holes VH4 are filled with via wirings V4 that electrically connect the wiring layer 25 to the wiring layer 24. The wiring layer 26 is stacked on the lower surface of the insulation layer 35. Via holes VH5 extend through the insulation layer 35 in the thickness-wise direction. The via holes VH5 are filled with via wirings V5 that electrically connect the wiring layer 26 to the wiring layer 25.

The via holes VH1 to VH5 and the via wirings V1 to V5 are tapered so that the diameter decreases from the lower side (side closer to wiring layer 26) to the upper side (side located closer to connection pads P1, namely, chip mounting surface) in FIG. 1A. For example, the via holes VH1 to VH5 each have the form of a generally truncated cone in which the upper open end has a smaller diameter than the lower open end. In the same manner, the via wirings V1 to V5 each have the form of a generally truncated cone in which the upper surface is smaller than the lower surface. The via wirings V1 to V5 may be formed from, for example, copper or copper alloy.

The insulation layers 31 to 35 are respectively located between the wiring layers 21 and 22, the wiring layers 22 and 23, the wiring layers 23 and 24, the wiring layers 24 and 25, and the wiring layers 25 and 26.

In the peripheral region A2, the wiring substrate 10 includes reinforcement patterns 40, 50, 60, 70, and 81 and reinforcement vias V12, V13, V14, and V15. In the same manner as the wiring layers 22 to 26, the reinforcement patterns 40, 50, 60, 70, and 81 and the reinforcement vias V12 to V15 may be formed from copper or a copper alloy.

The reinforcement pattern 40 is stacked on the lower surface of the insulation layer 31. The reinforcement pattern 40 is, for example, formed on the same plane as the wiring layer 22. The reinforcement pattern 40 includes reinforcement patterns 41 and reinforcement patterns 42, which are located at positions separated from the reinforcement patterns 41.

Each reinforcement pattern 41 is, for example, circular in a plan view. Each reinforcement pattern 42 is smaller than the reinforcement pattern 41 in a plan view. Each reinforcement pattern 42 is, for example, circular in a plan view. In the present specification, the term "circular in a plan view" includes not only a circle in strict terms but also a generally circular shape.

Each reinforcement pattern 42 is connected to one of the reinforcement vias V12. Each reinforcement pattern 42 functions as a pad that is arranged independently from the other reinforcement patterns 42 and from the reinforcement patterns 41. In the present example, each reinforcement pattern 42 includes only the pad that is connected to one of the reinforcement vias V12. In this manner, the reinforcement patterns 41 are separated from one another. Further, each reinforcement pattern 42 connected to one of the reinforcement vias V12 is separated from the other reinforcement patterns 42, each of which is connected to one of the other reinforcement vias V12.

The insulation layer 32 is arranged on the lower surface of the insulation layer 31 and covers the lower surface and the side surfaces of the wiring layer 22 and the lower surfaces and the side surfaces of the reinforcement patterns 41. The via holes VH12 extend through the insulation layer 32 in the thickness-wise direction at given locations in the peripheral region A2 and expose the lower surfaces and the side surfaces of the reinforcement patterns 42. Each via hole VH12 is partially overlapped in a plan view with the corresponding reinforcement pattern 42 but not with the reinforcement patterns 41.

As illustrated in FIG. 1B, each via hole VH12 extends in the thickness-wise direction from the lower surface of the insulation layer 32 to an intermediate position in the insulation layer 31, which is stacked on the insulation layer 32. In the present example, each via hole VH12 includes a through hole 32X, which extends through the entire insulation layer 32 in the thickness-wise direction, and a recess 31X, which is formed by reducing the insulation layer 31 in thickness from the lower surface of the insulation layer 31 immediately above the insulation layer 32.

As illustrated in FIG. 1C, in each via hole VH12, the recess 31X is in communication with the through hole 32X and located around the corresponding reinforcement pattern 42 in a plan view. The through hole 32X is larger than the reinforcement pattern 42 in a plan view to entirely expose the lower surface and the side surface of the reinforcement pattern 42. The through hole 32X has a top (upper open end of through hole 32X in FIG. 1B) that is, for example, circular in a plan view. The top of the through hole 32X has a larger area than the reinforcement pattern 42 in a plan view. In the present example, as illustrated in FIG. 1C, the top of the through hole 32X has a diameter $\Phi 1$ that is larger than the diameter $\Phi 2$ of the reinforcement pattern 42. For example, the diameter $\Phi 2$ of the reinforcement pattern 42 may be approximately 20 to 30 µm, and the diameter $\Phi 1$ of the top of the through hole 32X may be approximately 50 to 60 µm.

As illustrated in FIG. 1B, the recess 31X is formed by reducing the thickness of the insulation layer 31 at the portion located around the reinforcement pattern 42 in a plan view. Accordingly, in a plan view, the recess 31X surrounds the outer circumferential portion of the circular reinforcement pattern 42. The recess 31X is, for example, annular (ring-shaped) in a plan view. Further, the recess 31X exposes a portion of the upper surface of the reinforcement pattern 42 (outer circumference of reinforcement pattern 42 in present example). In the present example, a wall E1 (portion of insulation layer 31) is located in the central portion of the recess 31X at the inner side of the side surface of the reinforcement pattern 42 in a plan view. Thus, the wall E1 in the recess 31X is located above the reinforcement pattern 42 at a location overlapped with the reinforcement pattern 42 in a plan view. As a result, the outer circumferential portion of the reinforcement pattern 42 projects outwardly from the wall E1 (i.e., insulation layer 31) and defines an overhanging structure. The recess 31X has a width W1 that is, for example, approximately 10 to 20 µm.

In the present example, in the same manner as each via hole VH2 (refer to FIG. 1A), each via hole VH12 is tapered so that the diameter decreases from the lower side to the upper side as viewed in FIG. 1B. The wall E1 in the recess 31X extends in a direction generally normal to the upper surface of the reinforcement pattern 42.

The reinforcement via V12 is formed in each via hole VH12. In the present example, the through hole 32X and the recess 31X are filled with the reinforcement via V12. Accordingly, the reinforcement via V12 directly contacts and covers the entire lower surface and entire side surface of the reinforcement pattern 42. That is, the reinforcement via V12 surrounds the reinforcement pattern 42. In other words, the reinforcement pattern 42 is embedded in the reinforcement via V12. Thus, the reinforcement pattern 42 is separated from the adjacent reinforcement pattern 42.

Since the recess 31X is filled with the reinforcement via V12, the outer circumferential portion of the top of the reinforcement via V12 (upper side of reinforcement via V12 in FIG. 1B) extends into the insulation layer 31. Further, the top of the reinforcement via V12 directly contacts and covers the upper surface of the reinforcement pattern 42 exposed in the recess 31X. Thus, a portion of the reinforcement via V12 in the recess 31X forms a ring-shaped projection F1 that projects toward the inner side of the reinforcement pattern 42 to cover a portion (outer circumference) of the upper surface of the reinforcement pattern 42 in a plan view. The projection F1 of the reinforcement via V12 is located above the outer circumferential portion of the reinforcement pattern 42 (i.e., the overhanging structure), which projects toward the outer side from the wall E1 (insulation layer 31) in the recess 31X. The projection F1 has a width of, for example, 2 to 5 µm.

As illustrated in FIG. 1A, the reinforcement pattern 50 is stacked on the lower surface of the insulation layer 32. The reinforcement pattern 50 is, for example, formed on the same plane as the wiring layer 23. The reinforcement pattern 50 includes reinforcement patterns 51 and reinforcement patterns 52, which are located at positions separated from the reinforcement patterns 51.

Each reinforcement pattern 51 is connected by one of the reinforcement vias V12 to the corresponding reinforcement pattern 42. Each reinforcement pattern 51 is, for example, formed integrally with the reinforcement via V12. Each reinforcement pattern 51 functions as a pad that is arranged independently from the other reinforcement patterns 51 and from the reinforcement patterns 52. In the present example, each reinforcement pattern 51 includes only the pad that is connected to one of the reinforcement vias V12. In this manner, the reinforcement patterns 51 are separated from one another. Further, each reinforcement pattern 51 connected to one of the reinforcement vias V12 is separated from the other reinforcement patterns 51, each of which is connected to one of the other reinforcement vias V12.

Each reinforcement pattern 51 is located at a position overlapping the corresponding reinforcement pattern 42 and the corresponding reinforcement via V12 in a plan view. The reinforcement pattern 51 in a plan view is larger than the reinforcement pattern 42 and larger than the reinforcement via V12. For example, each reinforcement pattern 51 is circular in a plan view. The reinforcement pattern 51 may have a diameter of, for example, 90 to 100 µm.

Each reinforcement pattern 52 is connected to one of the reinforcement vias V13. Each reinforcement pattern 52 has the same structure as the reinforcement patterns 42. In the present example, each reinforcement pattern 52 includes only a pad that is connected to one of the reinforcement vias V13.

The insulation layer 33 is arranged on the lower surface of the insulation layer 32 and covers the lower surface and the side surface of the wiring layer 23 and the lower surfaces and the side surfaces of the reinforcement patterns 51. The via holes VH13 extend through the insulation layer 33 in the thickness-wise direction at given locations in the peripheral region A2 and expose the lower surfaces and the side surfaces of the reinforcement patterns 52. Each via hole VH13 includes a through hole, which extends through the entire insulation layer 33, and a recess, which is formed by reducing a portion of the insulation layer 32 in thickness from the lower surface of the insulation layer 32 around the corresponding reinforcement pattern 52. The via hole VH13 has the same structure as the via hole VH12 illustrated in FIG. 1B and thus will not be described in detail.

The reinforcement via V13 is formed in each via hole VH13. In the present example, the via hole VH13 is filled with the reinforcement via V13. Accordingly, the reinforcement via V13 directly contacts and covers the entire lower surface and entire side surface of the reinforcement pattern 52. Thus, the outer circumferential portion of the top of the reinforcement via V13 (upper side of the reinforcement via V13 in FIG. 1A) extends into the insulation layer 32. The reinforcement via V13 has the same structure as the reinforcement via V12 illustrated in FIG. 1B and thus will not be described in detail.

The reinforcement pattern 60 is stacked on the lower surface of the insulation layer 33. The reinforcement pattern 60 is, for example, formed on the same plane as the wiring layer 24. The reinforcement pattern 60 includes reinforcement patterns 61 and reinforcement patterns 62, which are located at positions separated from the reinforcement patterns 61. The reinforcement patterns 61 have the same structure as the reinforcement patterns 51, and the reinforcement patterns 62 have the same structure as the reinforcement patterns 52.

Each reinforcement pattern 61 is connected by one of the reinforcement vias V13 to the corresponding reinforcement pattern 52. Each reinforcement pattern 61 is, for example, formed integrally with the reinforcement via V13. Each reinforcement pattern 61 includes only a pad that is connected to one of the reinforcement vias V13. Further, each reinforcement pattern 62 is connected to one of the reinforcement vias V14. Each reinforcement pattern 62 includes only a pad that is connected to one of the reinforcement vias V14.

The reinforcement vias V13 and the reinforcement patterns 61 are located at positions separated from the reinforcement vias V12 and the reinforcement patterns 51 in a plan view. Accordingly, the tops of the reinforcement vias V13 are separated from the reinforcement patterns 51 in a plan view. This ensures that the outer circumferential portion of the top of each reinforcement via V13 extends into the insulation layer 32.

The insulation layer 34 is arranged on the lower surface of the insulation layer 33 and covers the lower surface and the side surface of the wiring layer 24 and the lower surfaces and the side surfaces of the reinforcement patterns 61. The via holes VH14 extend through the insulation layer 34 in the thickness-wise direction at given locations in the peripheral region A2 and expose the lower surfaces and the side surfaces of the reinforcement patterns 62. Each via hole VH14 includes a through hole, which extends through the entire insulation layer 34, and a recess, which is formed by reducing a portion of the insulation layer 33 in thickness from the lower surface of the insulation layer 33 around the corresponding reinforcement pattern 62. The reinforcement via V14 is formed in the via hole VH14. In the present example, the via hole VH14 is filled with the reinforcement via V14. The via holes VH14 and the reinforcement vias V14 have the same structures as the via holes VH12 and the reinforcement vias V12 illustrated in FIG. 1B and thus will not be described in detail.

The reinforcement pattern 70 is stacked on the lower surface of the insulation layer 34. The reinforcement pattern 70 is, for example, formed on the same plane as the wiring layer 25. The reinforcement pattern 70 includes reinforcement patterns 71 and reinforcement patterns 72, which are located at positions separated from the reinforcement patterns 71. The reinforcement patterns 71 have the same structure as the reinforcement patterns 51, and the reinforcement patterns 72 have the same structure as the reinforcement patterns 52.

Each reinforcement pattern 71 is connected by one of the reinforcement vias V14 to the corresponding reinforcement pattern 62. Each reinforcement pattern 71 is, for example, formed integrally with the reinforcement via V14. Each reinforcement pattern 71 includes only a pad that is connected to one of the reinforcement vias V14. Further, each reinforcement pattern 72 is connected to one of the reinforcement vias V15. Each reinforcement pattern 72 includes only a pad that is connected to one of the reinforcement vias V15.

The reinforcement vias V14 and the reinforcement patterns 71 are located at positions separated from the reinforcement vias V13 and the reinforcement patterns 61 in a plan view. Accordingly, the tops of the reinforcement vias V14 (upper sides of reinforcement vias V14 in FIG. 1A) are separated from the reinforcement patterns 61 in a plan view. This ensures that the outer circumferential portion of the top of each reinforcement via V14 extends into the insulation layer 33. The insulation layer 33 separates the reinforcement vias V14 and the reinforcement patterns 71 from the reinforcement vias V12 and the reinforcement patterns 51. In the present example, the reinforcement vias V14 and the reinforcement patterns 71 are located at positions overlapping the reinforcement vias V12 and the reinforcement patterns 51 in a plan view.

The insulation layer 35 is arranged on the lower surface of the insulation layer 34 and covers the lower surface and the side surface of the wiring layer 25 and the lower surfaces and the side surfaces of the reinforcement patterns 71. The via holes VH15 extend through the insulation layer 35 in the thickness-wise direction at given locations in the peripheral region A2 and expose the lower surfaces and the side surfaces of the reinforcement patterns 72. Each via hole VH15 includes a through hole, which extends through the entire insulation layer 35, and a recess, which is formed by reducing a portion of the insulation layer 34 in thickness from the lower surface of the insulation layer 34 around the corresponding reinforcement pattern 72. The reinforcement via V15 is formed in the via hole VH15. In the present example, the via hole VH15 is filled with the reinforcement via V15. The via holes VH15 and the reinforcement vias V15 have the same structures as the via holes VH12 and the reinforcement vias V12 illustrated in FIG. 1B and thus will not be described in detail.

The reinforcement patterns 81 are stacked on the lower surface of the insulation layer 35. The reinforcement patterns 81 are, for example, formed on the same plane as the wiring layer 26. Each reinforcement pattern 81 is connected by one of the reinforcement vias V15 to the corresponding reinforcement pattern 72. Each reinforcement pattern 81 is, for example, formed integrally with the reinforcement via V15. Each reinforcement pattern 81 includes only a pad that is connected to one of the reinforcement vias V15. The reinforcement patterns 81 have the same structure as the reinforcement patterns 51.

The reinforcement vias V15 and the reinforcement patterns 81 are located at positions separated from the reinforcement vias V14 and the reinforcement patterns 71 in a plan view. Accordingly, the tops of the reinforcement vias V15 (upper sides of reinforcement vias V15 in FIG. 1A) are separated from the reinforcement patterns 71 in a plan view. This ensures that the outer circumferential portion of the top of each reinforcement via V15 extends into the insulation layer 34. The insulation layer 34 separates the reinforcement vias V15 and the reinforcement patterns 81 from the reinforcement vias V13 and the reinforcement patterns 61. In the present example, the reinforcement vias V15 and the reinforcement patterns 81 are located at positions overlapping the reinforcement vias V13 and the reinforcement patterns 61 in a plan view.

As illustrated in FIG. 2, the reinforcement patterns 51, 61, 71, and 81 are arranged, for example, along each side of the wiring substrate 10 in the peripheral region A2. The ones of the reinforcement patterns 51, 61, 71, and 81 adjacent in the vertical direction (thickness-wise direction of wiring substrate 10) are not overlapped with each other in a plan view. For example, the reinforcement patterns 61 are adjacent to the reinforcement patterns 51 and 71 in the vertical direction. However, the reinforcement patterns 61 are separated from the reinforcement patterns 51 and 71 in a plan view. In the same manner, the reinforcement patterns 71, which are adjacent to the reinforcement patterns 81 in the vertical direction, are separated from the reinforcement patterns 81 in a plan view. In the present example, the ones of the reinforcement patterns 51, 61, 71, and 81 adjacent in the vertical direction are in a staggered (zigzagged) arrangement in a plan view. The pitch between the reinforcement pattern 51, 61, and 71 that are adjacent to one another in the vertical direction may be, for example, approximately 100 to 150 μm. The pitch between the reinforcement patterns 51, the pitch between the reinforcement patterns 61, the pitch between the reinforcement patterns 71, and the pitch between the reinforcement patterns 81 may be each, for example, approximately 200 to 300 μm.

As illustrated in FIG. 1A, a solder resist layer 36, which covers the wiring layer 26 and the reinforcement patterns 81, is stacked on the lower surface of the insulation layer 35, which is the outermost insulation layer (here, lowermost insulation layer). The solder resist layer 36 may be formed from, for example, an insulative resin such as an epoxy resin or an acrylic resin.

The solder resist layer 36 covers the lower surfaces and side surfaces of the reinforcement patterns 81. Further, the solder resist layer 36 includes openings 36X that expose portions of the lower surface of the wiring layer 26, which is the lowermost wiring layer, as external connection pads P2. The external connection pads P2 are connected to external connection terminals such as solder balls or lead pins that are used when mounting the wiring substrate onto a mounting substrate such as a motherboard. In the present embodiment, the surface of the wiring substrate 10 on which the external connection pads P2 are formed serves as an external connection terminal surface.

When necessary, a surface-processed layer may be formed on the surface of each external connection pad P2. Examples of a surface-processed layer include an Au layer, an Ni layer/Au layer (metal layer obtained by stacking Ni layer and Au layer in this order), and an Ni layer/Pd layer/Au layer (metal layer obtained by stacking Ni layer, Pd layer, and Au layer in this order). The Ni layer, Au layer, and Pd layer may be an electroless plating metal layer formed through electroless plating. The Au layer is a metal layer of Au or an Au alloy. The Ni layer is a metal layer of Ni or an Ni alloy. The Pd layer is a metal layer of Pd or a Pd alloy. Further, a surface-processed layer that undergoes an anti-oxidation process such as an organic solderability preservative (OSP) process may be formed on the surface of each external connection pad P2. For example, when undergoing the OSP process, an organic film of an azole compound or an imidazole compound is formed as the surface-processed layer on the surface of each external connection pad P2. Portions of the wiring layer 26 exposed in the openings 36X may be used as the external connection terminals. Alternatively, a surface-processed layer formed on the wiring layer 26 may be used as the external connection terminals.

The structure of a semiconductor device 11 will now be described with reference to FIG. 3. The semiconductor device 11 includes the wiring substrate 10, the semiconductor chip 15, and an underfill resin 16.

The semiconductor chip 15 is flip-chip-mounted on the wiring substrate 10. In the present example, bumps 15A are arranged on a circuit formation surface (here, lower surface) of the semiconductor chip 15 and bonded to the connection pads P1 of the wiring substrate 10 to electrically connect the semiconductor chip 15 to the wiring layer 21 of the wiring substrate 10 via the bumps 15A.

The semiconductor chip 15 may be a logic chip such as a central processing unit (CPU) chip or a graphics processing unit (GPU) chip. Further, the semiconductor chip 15 may be a memory chip such as a dynamic random access memory (DRAM) chip, a static random access memory (SRAM) chip, or a flash memory chip.

The bumps 15A may be, for example, metal bumps or solder bumps. Solder bumps may be formed from, for example, an alloy including lead (Pb), an alloy of tin (Sn) and Au, an alloy of Sn and Cu, an alloy of Sn and silver (Ag), an alloy of Sn, Ag, and Cu, or the like.

The gap between the wiring substrate 10 and the semiconductor chip 15 is filled with the underfill resin 16. The underfill resin 16 may be formed from, for example, an insulative resin such as an epoxy resin.

In the present embodiment, the wiring layer 22 is one example of a first wiring layer, the wiring layer 23 is one example of a second wiring layer, the insulation layer 31 is one example of a first insulation layer, the insulation layer 32 is one example of a second insulation layer, and the insulation layer 33 is one example of a third insulation layer. Further, each reinforcement pattern 42 is one example of a first reinforcement pattern, each reinforcement pattern 51 is one example of a second reinforcement pattern, each reinforcement pattern 52 is one example of a third reinforcement pattern, each reinforcement pattern 61 is one example of a fourth reinforcement pattern, each reinforcement via V12 is one example of a first reinforcement via, and each reinforcement via V13 is one example of a second reinforcement via. Each through hole 32X is one example of a through hole, each recess 31X is one example of a recess, and each via hole VH12 is one example of a via hole.

A method for manufacturing the wiring substrate 10 will now be described. FIGS. 4A to 7B are partial, enlarged views of the wiring substrate 10. To aid understanding, components that ultimately function as the elements of the wiring substrate 10 are denoted by the reference characters added to such elements.

Figure 4A:
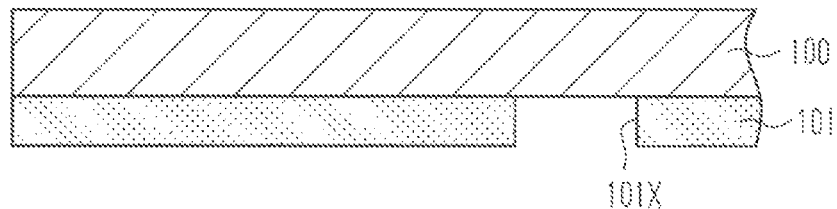
FIGS. 4A to 4D, 5A to 5D, 6A to 6C, and 7A are schematic cross-sectional views illustrating a method for manufacturing the wiring substrate of FIG. 1A.

Referring to FIG. 4A, a support substrate 100 is first prepared. For example, a metal plate or metal foil may be used as the support substrate 100. A copper foil, for example, is used in the present embodiment. The support substrate 100 has a thickness of, for example, 35 to 100 µm.

A resist layer 101 including an opening pattern 101X is formed on the lower surface of the support substrate 100. The opening pattern 101X exposes the lower surface of the support substrate 100 at a portion corresponding to a region where the wiring layer 21 (refer to FIG. 1A) is formed. The resist layer 101 may be formed by, for example, a photosensitive dry film, a photoresist liquid, or the like. Such a material of the resist layer 101 may be, for example, a novolac resin or an acrylic resin. For example, when using a photosensitive dry film resist, thermos-compression bonding is performed to laminate a dry film on the lower surface of the support substrate 100, and a photolithography process is performed to pattern the dry film and form the resist layer 101. When using a photoresist liquid, similar steps are performed to form the resist layer 101.

Figure 4B:
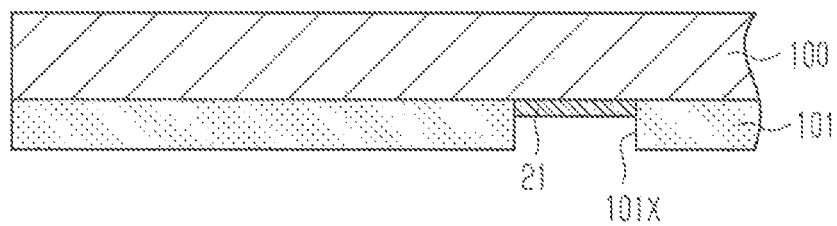

In the step illustrated in FIG. 4B, the wiring layer 21 is formed on the support substrate 100 exposed in the opening pattern 101X of the resist layer 101. For example, electrolytic plating is performed using the resist layer 101 as a plating mask and the support substrate 100 as a plating power supplying layer to form the wiring layer 21 on the lower surface of the support substrate 100 exposed in the opening pattern 101X. For example, when the wiring layer 21 is a stack of a first conductive layer, which is a Cu layer, and a second conductive layer, which is an Ni layer/Au layer, electrolytic plating is first performed to sequentially stack an Au layer and an Ni layer to form the second conductive layer. Then, electrolytic plating is performed to stack a Cu layer on the second conductive layer to form the first conductive layer.

Then, the resist layer 101 is removed by, for example, an alkali stripping liquid. In the step illustrated in FIG. 4C, the insulation layer 31 is formed on the lower surface of the support substrate 100 to cover the wiring layer 21. When using a resin film as the insulation layer 31, for example, after laminating a resin film on the support substrate 100, the resin film undergoes a heat treatment at a temperature of approximately 130° C. to 190° C. while being pressed. This hardens the resin film and forms the insulation layer 31. As an example, an epoxy resin may be used as the material of the resin film. When using a liquid or paste of insulative resin as the insulation layer 31, spin coating is performed to apply the liquid or paste of insulative resin to the support substrate 100. The applied insulative resin undergoes a heat treatment at a temperature of approximately 130° C. to 190° C. This hardens the insulative resin and forms the insulation layer 31.

Figure 4C:
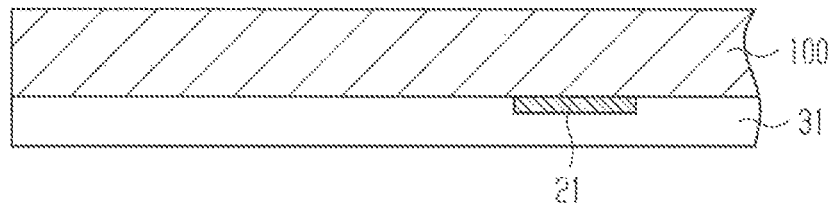
Figure 4D:
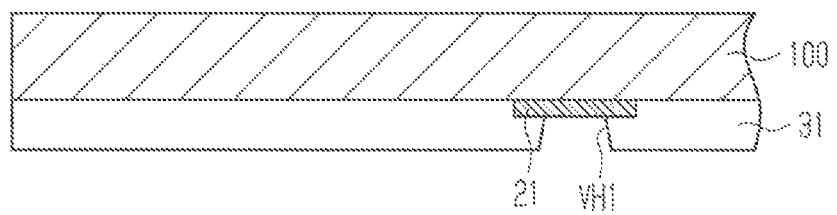

In the step illustrated in FIG. 4D, the via holes VH1 are formed in the insulation layer 31 to partially expose the lower surface of the wiring layer 21. The via holes VH1 may be formed through laser processing using, for example, a $CO_2$ laser, a YAG laser, or the like. When the insulation layer 31 is formed from a photosensitive resin, for example, photolithography may be performed to form the via holes VH1.

When laser processing is performed to form the via holes VH1, a desmearing process is performed to remove resin smears (resin residue) from the surface of the wiring layer 21 exposed in the via holes VH1.

Figure 5A:
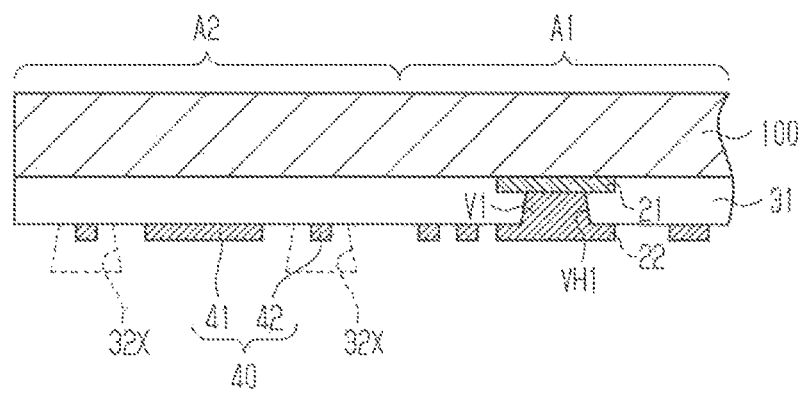

In the step illustrated in FIG. 5A, each via hole VH1 is filled with a via conductor to form the via wiring V1. Further, the wiring layer 22 is stacked on the lower surface of the insulation layer 31 so that the via wiring V1 electrically connects the wiring layer 21 to the wiring layer 22. The reinforcement patterns 41 and 42 are formed on the lower surface of the insulation layer 31 in the peripheral region A2. Each reinforcement pattern 42, which has a circular planar shape, is smaller in diameter than the top (upper open end in FIG. 5B) of the through hole 32X formed in a subsequent step. The via wirings V1, the wiring layer 22, and the reinforcement patterns 41 and 42 may be formed through, for example, any of a variety of wiring formation processes such as the semi-additive process or the subtractive process. Further, the wiring layer 22 and the reinforcement patterns 41 and 42 may be simultaneously formed in the same step.

Figure 5B:
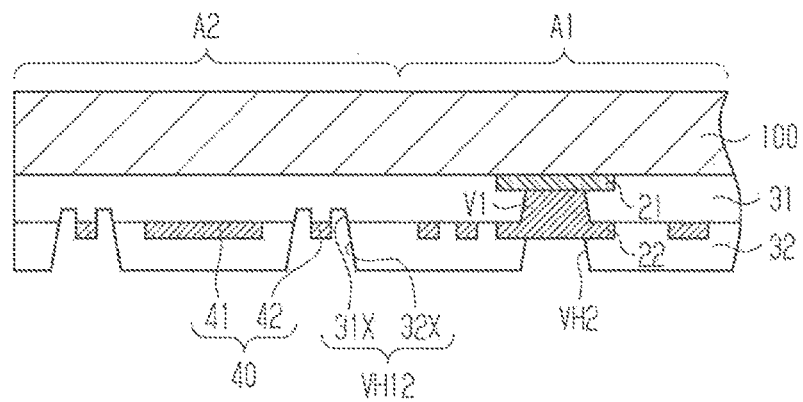

In the step illustrated in FIG. 5B, like in the step of FIG. 4C, the insulation layer 32 is formed on the lower surface of the insulation layer 31 to cover the wiring layer 22 and the reinforcement patterns 41 and 42. Then, laser processing is performed to form the via holes VH2, which extend through the insulation layer 32 in the wiring formation region A1, and the via holes VH12, which extend through the insulation layer 32 in the peripheral region A2. The via holes VH2 partially expose the lower surface of the wiring layer 22, and the via holes VH12 expose the lower surfaces and side surfaces of the reinforcement patterns 42. When forming each via hole VH12, the through hole 32X is first formed extending through the insulation layer 32 in the thicknesswise direction and entirely exposing the lower surface and side surface of the corresponding reinforcement pattern 42. Then, the recess 31X is formed by reducing the insulation layer 31 in thickness from the lower surface of the insulation layer 31 around the reinforcement pattern 42. Here, the top (upper open end in FIG. 5B) of the through hole 32X is formed to be larger than the reinforcement pattern 42 in a plan view. Thus, when the through hole 32X is formed, a laser beam is emitted to the lower surface of the insulation layer 31 around the reinforcement pattern 42. The laser beam removes a portion (reduces thickness) of the insulation layer 31 from the lower surface thereof. Consequently, the recess 31X is formed in the insulation layer 31 in communication with the outer circumferential portion of the top of the through hole 32X. This forms the via hole VH12 that includes the through hole 32X and the recess 31X. The via holes VH2 and VH12 are formed in the same step.

Figure 5C:
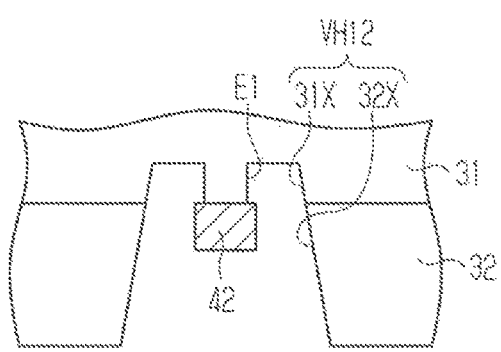

Then, a desmearing process is performed to remove resin smears from the exposed surface of the wiring layer 22 in each via hole VH2 and the exposed surface of the reinforcement pattern 42 in each via hole VH12. The desmearing process may be, for example, wet desmearing that uses an alkali permanganate aqueous solution. Such a desmearing process removes resin smears and etches the insulation layers 31 and 32 exposed in the via holes VH2 and VH12. Referring to FIG. 5C, this forms the wall E1 (portion of insulation layer 31) in the central portion of each recess 31X. The wall E1 is located at an inner side of the side surface of the corresponding reinforcement pattern 42 in a plan view. As a result, the outer circumference of the upper surface of the reinforcement pattern 42 is exposed in the recess 31X. In this manner, the partial etching of the insulation layer 31 in addition to the removal of the resin smear exposes the outer circumference of the upper surface of the reinforcement pattern 42.

Figure 5D:
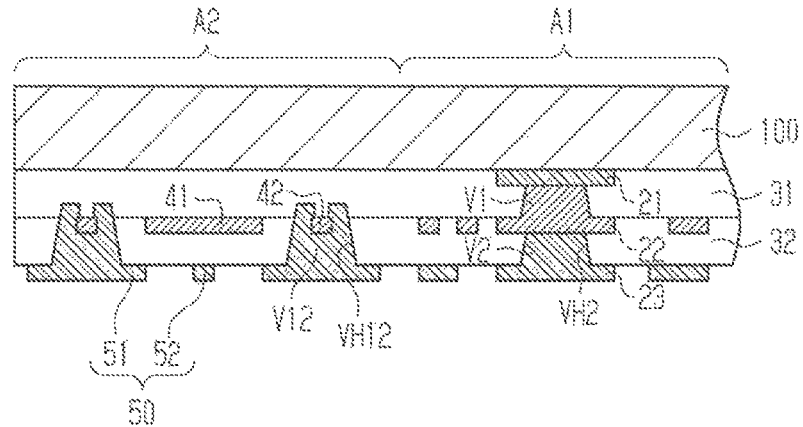

In the step illustrated in FIG. 5D, each via hole VH2 is filled with a via conductor to form the via wiring V2. Further, the wiring layer 23 is stacked on the lower surface of the insulation layer 32 so that the via wiring V2 electrically connects the wiring layer 22 to the wiring layer 23. Each via hole VH12 is filled with a via conductor to form the reinforcement via V12. The reinforcement via V12 partially covers the upper surface of the corresponding reinforcement pattern 42 and entirely covers the side surface and the lower surface of the reinforcement pattern 42. The reinforcement patterns 51 are stacked on the lower surface of the insulation layer 32, and the reinforcement vias V12 connect the reinforcement patterns 42 to the reinforcement patterns 51. The reinforcement patterns 52 are formed on the lower surface of the insulation layer 32 in the peripheral region A2 at locations separated from the reinforcement patterns 51. The via wirings V2, the wiring layer 23, the reinforcement patterns 51 and 52, and the reinforcement vias V12 may be formed through, for example, a semi-additive process. For example, electroless plating (e.g., electroless copper plating) or sputtering is performed to form a seed layer. The seed layer continuously covers the wall surface of each via hole VH2, the lower surface of the wiring layer 22 exposed in each via hole VH2, the lower surface of the insulation layer 32, the inner surface of each via hole VH12, and the surface of the reinforcement pattern 42 exposed in each via hole VH12. A resist layer including openings shaped in correspondence with the wiring layer 23 and the reinforcement patterns 51 and 52 is formed on the seed layer. Then, electrolytic plating (e.g., electrolytic copper plating) is performed using the seed layer as a power supplying layer to deposit plating metal on the seed layer exposed in the openings of the resist layer. After removing the resist layer, the plating metal is used as a mask to perform etching and remove the resist layer. As a result, the plating metal in each via hole VH2 forms the via wiring V2, and the plating metal in each via hole VH12 forms the reinforcement via V12.

Further, the wiring layer 23 is formed on the lower surfaces of the via wirings V2 and the insulation layer 32, the reinforcement patterns 51 are formed on the lower surfaces of the reinforcement vias V12 and the insulation layer 32, and the reinforcement patterns 52 are formed on the lower surface of the insulation layer 32. In this manner, the via wirings V2, the wiring layer 23, the reinforcement vias V12, and the reinforcement patterns 51 and 52 are simultaneously formed in the same step. The process for forming the via wirings V2, the wiring layer 23, the reinforcement patterns 51 and 52, and the reinforcement vias V12 is not limited to the semi-additive process described above and any of a variety of wiring formation processes such as the subtractive process may be employed instead.

Figure 6A:
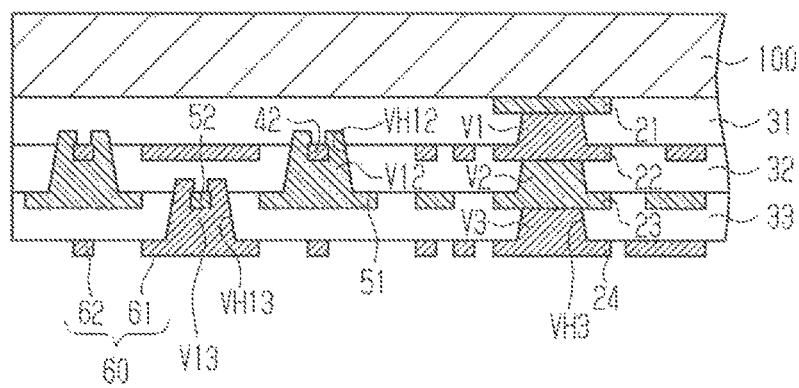

In the step illustrated in FIG. 6A, like in the steps of FIGS. 5B and 5C, the insulation layer 33 including the via holes VH3 and VH13 is formed on the lower surface of the insulation layer 32. Then, like in the step of FIG. 5D, the via holes VH3 are filled with the via wirings V3, and the wiring layer 24 is formed on the lower surface of the insulation layer 33. Further, the via holes VH13 are filled with the reinforcement vias V13, and the reinforcement patterns 61 and 62 are stacked on the lower surface of the insulation layer 33.

Figure 6B:
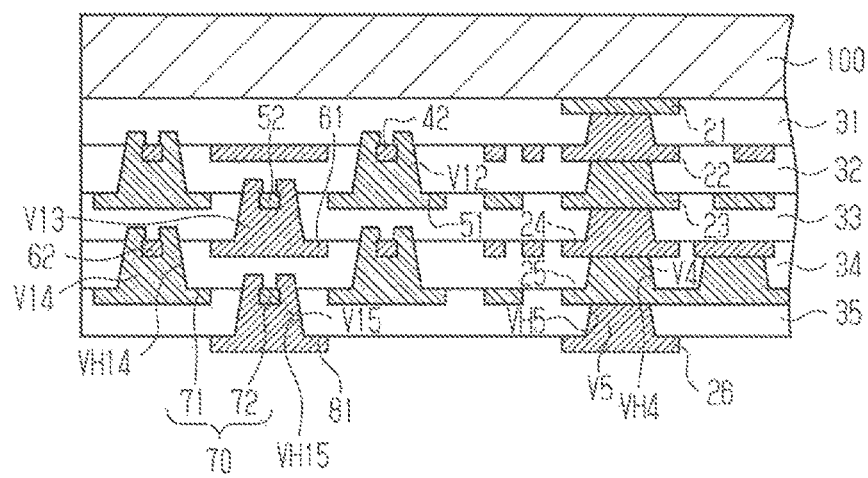

In the step illustrated in FIG. 6B, the steps of FIGS. 5B to 5D are repetitively performed. First, the insulation layer 34 including the via holes VH4 and VH14 is stacked on the lower surface of the insulation layer 33. Then, the via wirings V4 are formed in the via holes VH4, and the reinforcement vias V14 are formed in the via holes VH14. Further, the wiring layer 25 and the reinforcement patterns 71 and 72 are stacked on the lower surface of the insulation layer 34. Next, the insulation layer 35 including the via holes VH5 and VH15 is stacked on the lower surface of the insulation layer 34. Then, the via wirings V5 are formed in the via holes VH5, and the reinforcement vias V15 are formed in the via holes VH15. Further, the wiring layer 26 and the reinforcement patterns 81 are stacked on the lower surface of the insulation layer 35.

Figure 6C:
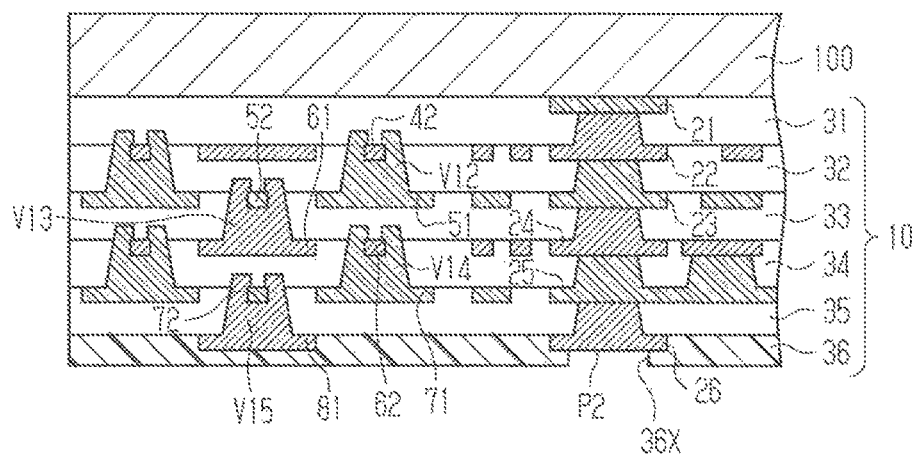

In the step illustrated in FIG. 6C, the solder resist layer 36, which includes the openings 36X exposing given locations of the wiring layer 26 as the external connection pads P2, is formed on the lower surface of the insulation layer 35. The solder resist layer 36 may be formed by, for example, laminating a photosensitive solder resist film or applying a solder resist liquid and patterning the resist into a given shape. When necessary, a metal layer may be stacked on each external connection pad P2 by stacking, for example, an Ni layer and an Au layer in this order. Alternatively, an OSP film may be formed on each external connection pad P2. The Ni layer and the Au layer may be formed through, for example, electroless plating.

A structure corresponding to the wiring substrate 10 is manufactured on the lower surface of the support substrate 100 through the steps described above.

Figure 7A:
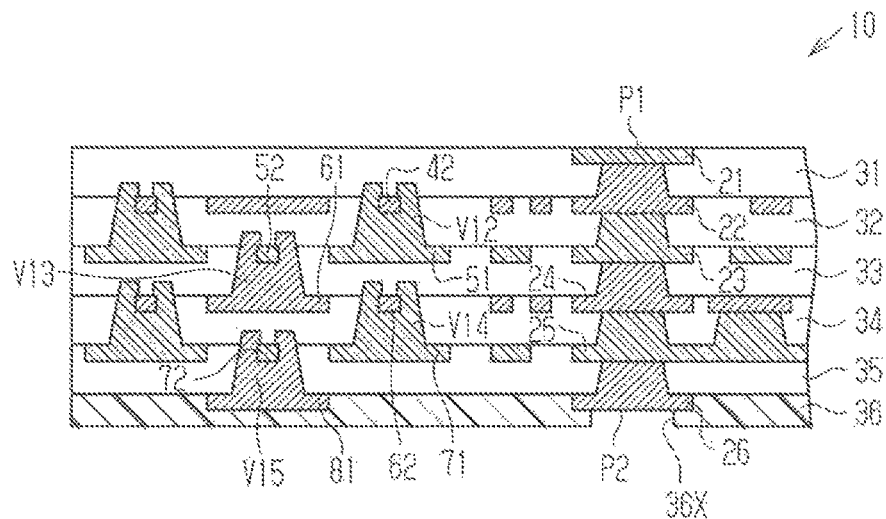

In the step illustrated in FIG. 7A, the support substrate 100 (refer to FIG. 6C), which has been used as a temporary substrate, is removed. This exposes the upper surface of the insulation layer 31 to the outside and exposes the upper surface of the wiring layer 21 as the connection pads P1. For example, when a copper foil is used as the support substrate 100, wet etching using a ferric chloride aqueous solution, a copper(II) chloride aqueous solution, an ammonium persulfate aqueous solution, or the like is performed to remove the support substrate 100. The outermost layer of the wiring layer 21 exposed in the upper surface of the insulation layer 31 is an Au layer or the like. This allows for selective removal of only the support substrate 100, which is a copper foil. However, when the outermost surface of the wiring layer 26 is a copper layer, the wiring layer 26 needs to be masked when performing the wet etching to prevent the wiring layer 26 exposed in the openings 36X from being etched together with the support substrate 100. The wiring substrate 10 of the present embodiment is manufactured through the steps described above.

A method for manufacturing the semiconductor device 11 will now be described.

Figure 7B:
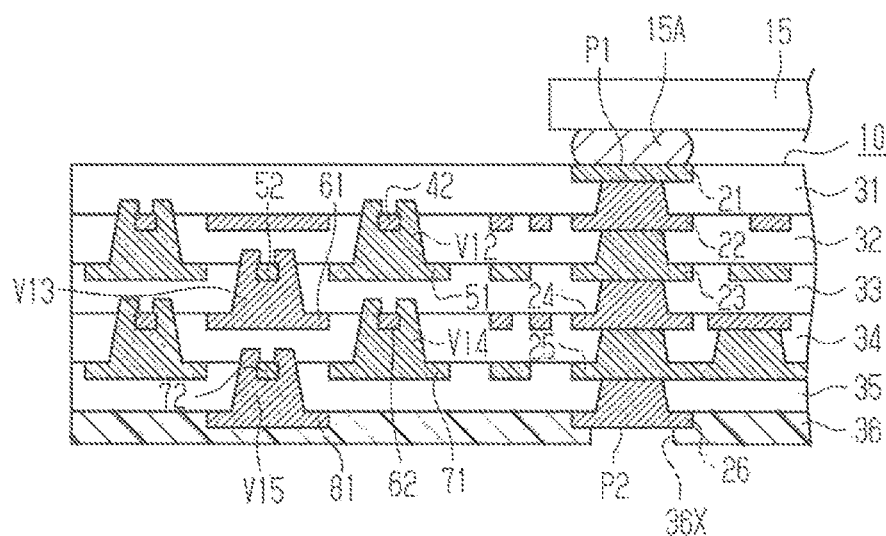
FIG. 7B is a schematic cross-sectional view illustrating a method for manufacturing the semiconductor device of FIG. 3.

In the step illustrated in FIG. 7B, the semiconductor chip 15 is mounted on the wiring substrate 10. In the present example, the bumps 15A of the semiconductor chip 15 are flip-chip-bonded to the connection pads P1 of the wiring substrate 10. Then, the gap between the flip-chip-bonded semiconductor chip 15 and the wiring substrate 10 is filled with the underfill resin 16 (refer to FIG. 3). Subsequently, the underfill resin 16 is hardened. The semiconductor device 11 illustrated in FIG. 3 is manufactured through the steps described above.

The present embodiment has the advantages described below.

(1) The wiring substrate 10 in the peripheral region A2 includes the reinforcement vias V12 that extend through the insulation layer 32 in the thickness-wise direction. Each of the reinforcement vias V12 is in contact with and connected to the entire side surface, the entire lower surface, and the outer circumference of the upper surface of the corresponding reinforcement pattern 42. The outer circumferential portion of the top of the reinforcement via V12 extends into the insulation layer 31, which is formed directly above the insulation layer 32. Thus, the interface of each reinforcement via V12 and the insulation layers 31 and 32 and the interface of each reinforcement pattern 42 and the insulation layer 31 have a structure that is more complicated than that of the wiring substrate 200 of the related art (refer to FIG. 16) in which the top of the reinforcement post 205 (upper side of reinforcement post 205 in FIG. 16) is formed on the lower surface of the reinforcement pattern 203. As a result, external impact and thermal stress is transmitted through a complicated route. This absorbs or reduces the impact and thermal stress and limits cracking at the interface of each reinforcement via V12 and the insulation layers 31 and 32 and the interface of each reinforcement pattern 42 and the insulation layer 31. Even when cracking occurs in the interfaces, progress of cracking would be hindered in the interfaces. This limits delamination of the reinforcement patterns 42 and the reinforcement vias V12 from the insulation layer 32.

(2) The outer circumferential portion of the top of each reinforcement via V12 extends into the insulation layer 31. This increases the adhesion of the reinforcement via V12 with the insulation layers 31 and 33 as compared to when the top of the reinforcement post 205 is formed on the lower surface of the reinforcement pattern 203 (refer to FIG. 16). Consequently, the strength increases for resisting the tensile force produced by the difference in coefficient of thermal expansion between the reinforcement vias V12 and the insulation layers 31 and 32. This limits removal of the reinforcement via V12 from the via hole VH12.

(3) The top of each through hole 32X (upper open end of through hole 32X in FIG. 1B) is larger than the corresponding reinforcement pattern 42 in a plan view to expose the entire side surface and entire lower surface of the reinforcement pattern 42. Thus, the reinforcement via V12 contacts and covers the outer circumference of the upper surface, the entire side surface, and the entire lower surface of the reinforcement pattern 42. This increases the area of contact between the reinforcement via V12 and the reinforcement pattern 42 as compared with when the top of the reinforcement post 205 is formed on the lower surface of the reinforcement pattern 203 (refer to FIG. 16) like in the related art. Thus, in contrast with the related art, the present embodiment disperses stress resulting from the difference in coefficient of thermal expansion between the reinforcement vias V12 and the insulation layers 31 and 32. This limits wire breakage and cracking between the reinforcement vias V12 and the reinforcement patterns 42.

(4) Each via hole VH12 includes the recess 31X that exposes the outer circumference of the upper surface of the corresponding reinforcement pattern 42. Thus, the reinforcement via V12 contacts and covers the upper surface and the outer circumference of the reinforcement pattern 42 in the recess 31X. That is, the reinforcement via V12 is formed on the reinforcement pattern 42. This further increases the adhesion between the reinforcement via V12 and the reinforcement pattern 42. In addition, this results in the interface between the reinforcement vias V12 and the insulation layers 31 and 32 and the interface between the reinforcement patterns 42 and the insulation layer 31 having a further complicated structure. Thus, the occurrence of cracking is limited at the interfaces.

(5) The reinforcement pattern 42 and the reinforcement pattern 51 that are connected by one of the reinforcement vias V12 are independent from the other reinforcement patterns and reinforcement vias. In other words, each reinforcement pattern 42 includes only a pad that is connected to one of the reinforcement vias V12, and each reinforcement pattern 51 also includes only a pad that is connected to one of the reinforcement vias V12. Thus, the reinforcement patterns 42 and 51 are each isolated (separated) from the adjacent reinforcement patterns 42 and 51 and do not extend continuously on the same plane. In comparison with the reinforcement pattern 206 that extends continuously on the same plane like in the related art, stress may be reduced that is caused by the difference in the coefficient of thermal expansion between the reinforcement patterns 42 and 51 and the insulation layers 32 and 33. This limits the occurrence of cracking or the like at the interfaces of the reinforcement patterns 42 and 51 and the insulation layers 32 and 33.

Figure 16:
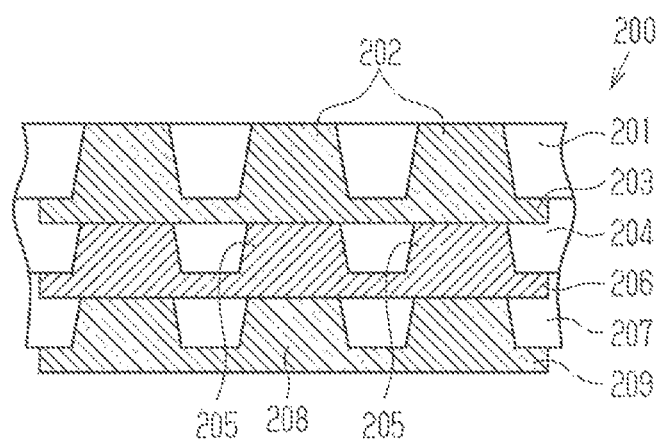
FIG. 16 is a schematic cross-sectional view illustrating a wiring substrate of the related art.

(6) When the reinforcement posts 202, 205, and 208 are in a stacked via structure like in the wiring substrate 200 of the related art illustrated in FIG. 16, cracking has a tendency to occur at the interfaces of the reinforcement posts 202, 205, 208 and the insulation layers 201, 204, and 207. It is understood that such cracking occurs due to the reasons that will now be described. When stacking the reinforcement posts 202, 205, and 208 that have the same diameter, the reinforcement posts 202, 205, and 208 are stacked straight in the stacking direction. Further, the interfaces of the reinforcement posts 202, 205, and 208 and the insulation layers 201, 204, and 207 are also aligned straight in the stacking direction. Accordingly, when stress is generated by the difference in the coefficient of thermal expansion between the reinforcement posts 202, 205, and 208 and the insulation layers 201, 204, and 207, it is difficult to reduce the stress. Thus, cracking has a tendency to occur at the interface between the reinforcement posts 202, 205, and 208 and the insulation layers 201, 204, and 207.

By contrast, in the wiring substrate 10 of the present embodiment, the reinforcement vias V12 and V13 that are adjacent in the stacking direction (vertical direction) are not overlapped with one another in a plan view. Thus, the interfaces of the reinforcement vias V12 and the insulation layers 31 and 32 and the interfaces of the reinforcement vias V13 and the insulation layers 32 and 33 are not arranged straight in the stacking direction. This reduces the stress generated by the difference in the coefficient of thermal expansion between the reinforcement vias V12 and V13 and the insulation layers 31 to 33. As a result, the occurrence of cracking is limited at the interfaces of the reinforcement vias V12 and V13 and the insulation layers 31 to 33.

(7) The reinforcement patterns 40, 50, 60, 70, and 81 and the reinforcement vias V12 to V15 are located in the peripheral region A2. The reinforcement patterns 40, 50, 60, 70, and 81 and the reinforcement vias V12 to V15 have a higher rigidity than the insulation layers 31 to 35, which are formed from a resin. Thus, the reinforcement patterns 40, 50, 60, 70, and 81 and the reinforcement vias V12 to V15 increase the rigidity in the peripheral region A2. This reduces warping of the wiring substrate 10. Further, the difference in thickness of the insulation layers 31 to 35 may be decreased in the peripheral region A2 as compared with when the reinforcement patterns 40, 50, 60, 70, and 81 and the reinforcement vias V12 to V15 are omitted.

Second Embodiment

Figure 8A:
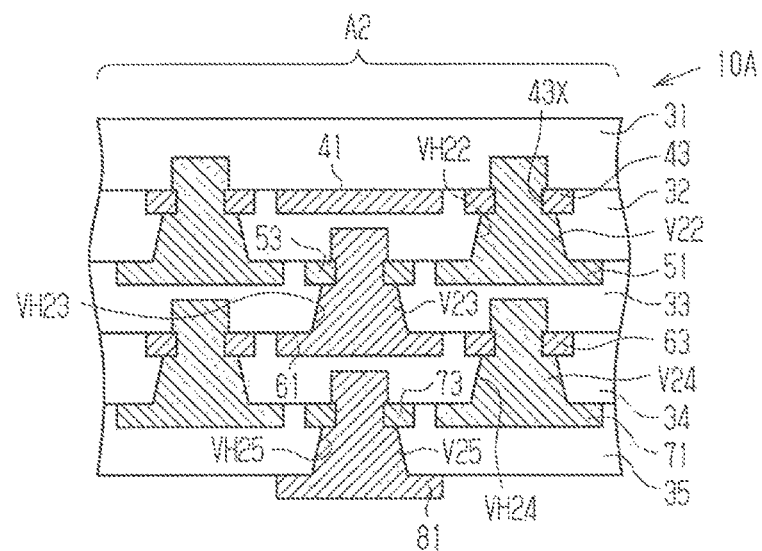
FIG. 8A is a schematic cross-sectional view illustrating a portion of a wiring substrate in a second embodiment.
Figure 8B:
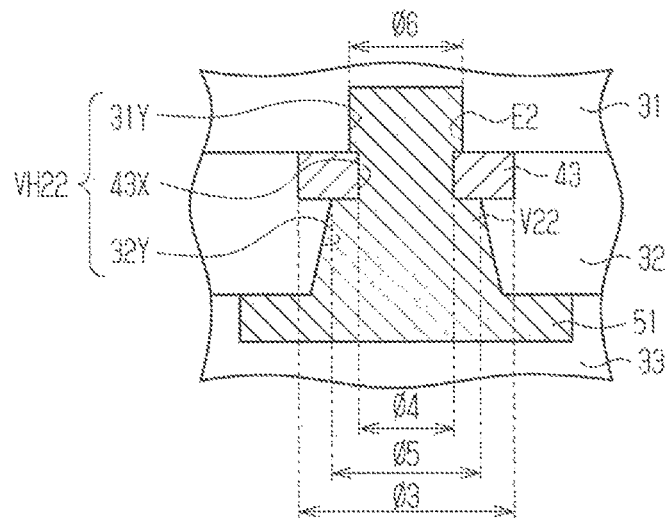
FIG. 8B is a partial, enlarged cross-sectional view illustrating the wiring substrate of FIG. 8A.

A second embodiment will now be described with reference to FIGS. 8A to 10D. A wiring substrate 10A of the second embodiment differs from the wiring substrate 10 of the first embodiment in the structures of the reinforcement patterns and the reinforcement vias. The description hereafter will focus on the differences from the first embodiment. FIGS. 8A and 8B are enlarged cross-sectional views illustrating the structure of the portion (peripheral region A2) that differs from the first embodiment. The solder resist layer 36 is not illustrated in FIGS. 8A and 8B. Same reference numerals are given to those components that are the same as the corresponding components illustrated in FIGS. 1A to 7B. Such components will not be described in detail.

Referring to FIG. 8A, reinforcement patterns 43, 53, 63, and 73, which are ring-shaped in a plan view, are formed in the peripheral region A2 of the wiring substrate 10A in lieu of the circular reinforcement patterns 42, 52, 62, and 72, which are illustrated in FIG. 1A. The reinforcement patterns 43, 53, 63, and 73 are stacked on the lower surfaces of the insulation layers 31, 32, 33, and 34, respectively. Further, via holes VH22, VH23, VH24, and VH25 and reinforcement vias V22, V23, V24, and V25 are formed in the wiring substrate 10A in lieu of the via holes VH12, VH13, VH14, and VH15 and the reinforcement vias V12, V13, V14, and V15, which are illustrated in FIG. 1A. The reinforcement patterns 43, 53, 63, and 73 and the reinforcement vias V22, V23, V24, and V25 may be formed from, for example, copper or a copper alloy.

Figure 9:
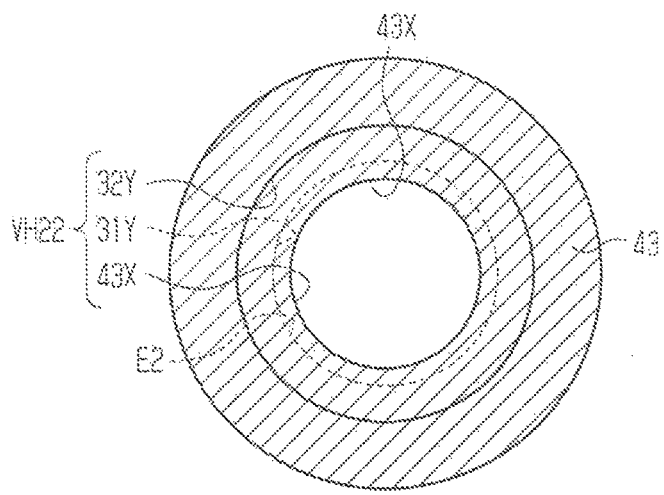
FIG. 9 is a schematic plan view illustrating a reinforcement pattern and a via hole in the second embodiment.

Referring to FIG. 9, each reinforcement pattern 43 is ring-shaped (frame-shaped) and includes a bore 43X extending through a central portion of the reinforcement pattern 43 in a plan view. In the present example, the reinforcement pattern 43 is annular in a plan view, and the bore 43X is circular in a plan view.

As illustrated in FIG. 8B, each via hole VH22 extends through the insulation layer 32 in the thickness-wise direction and exposes a portion of the lower surface of the corresponding reinforcement pattern 43 and an inner surface (bore 43X) of the reinforcement pattern 43. Each via hole VH22 reduces the thickness of a portion of the insulation layer 31 formed directly on the insulation layer 32.

The via hole VH22 includes a through hole 32Y, which extends through the insulation layer 32 in the thickness-wise direction, the bore 43X of the reinforcement pattern 43, and a recess 31Y formed by reducing the insulation layer 31 in thickness from the lower surface of the insulation layer 31 exposed in the bore 43X.

The through hole 32Y is in communication with the bore 43X. A portion of the through hole 32Y is overlapped in a plan view with a portion of the reinforcement pattern 43. In the present example, the through hole 32Y is overlapped with the entire bore 43X of the reinforcement pattern 43 in a plan view and overlapped with a portion (inner circumferential portion) of the reinforcement pattern 43, which is located around the bore 43X. Thus, the lower surface of the reinforcement pattern 43 around the bore 43X and the wall surface of the bore 43X are exposed in the through hole 32Y. The outer circumferential portion of the reinforcement pattern 43 is not exposed in the through hole 32Y (via hole VH22) and is covered by the insulation layer 32.

The top of the through hole 32Y (upper open end of through hole 32Y in FIG. 8B) is, for example, larger than the bore 43X and smaller than the outer shape of the reinforcement pattern 43 in a plan view. Further, the top of the through hole 32Y is circular in a plan view. The top of the through hole 32Y has a diameter $\Phi 5$ that is smaller than the outer diameter $\Phi 3$ of the reinforcement pattern 43 and larger than the diameter $\Phi 4$ of the bore 43X.

The recess 31Y is in communication with the through hole 32Y and the bore 43X. The recess 31Y is formed by reducing the thickness of the insulation layer 31 exposed in the bore 43X of the reinforcement pattern 43. The recess 31Y is circular in a plan view like the bore 43X. The recess 31Y has a diameter $\Phi 6$ that is larger than the diameter $\Phi 4$ of the bore 43X to expose a portion (inner circumferential portion) of the upper surface of the reinforcement pattern 43. The recess 31Y includes a wall E2 (portion of insulation layer 31) located at the outer side of the wall surface of the bore 43X in a plan view. The wall E2 of the recess 31Y is located on the reinforcement pattern 43 and overlapped with the reinforcement pattern 43 in a plan view. As a result, a portion (inner circumferential portion) of the reinforcement pattern 43 that defines the bore 43X is ring-shaped and projected inwardly from the wall E2 (i.e., insulation layer 31) into the via hole VH22 to form an overhanging structure below the recess 31Y.

The through hole 32Y of the via hole VH22 is, for example, tapered so that the diameter decreases from the lower side toward the upper side as viewed in FIG. 8. The wall E2 of the recess 31Y extends, for example, in a direction normal to the upper surface of the reinforcement pattern 43.

The reinforcement via V22 is formed in the via hole VH22. The through hole 32Y, the bore 43X, and the recess 31Y are filled with the reinforcement via V22. Since the recess 31Y is filled with the reinforcement via V22, the central portion of the top of the reinforcement via V22 (upper end of reinforcement via V22 in FIG. 8B) extends into the insulation layer 31. The reinforcement via V22 contacts and covers the entire exposed surface of the reinforcement pattern 43 in the via hole VH22. In the present example, the reinforcement via V22 covers the inner circumference of the upper surface, the inner circumference of the lower surface, and the entire inner surface (bore 43X) of the reinforcement pattern 43. Accordingly, the reinforcement pattern 43 extends into the reinforcement via V22 in the via hole VH22. In the present example, as described above, the inner circumferential portion of the reinforcement pattern 43 is ring-shaped and projected into the via hole VH22 to form the overhanging structure. Thus, the reinforcement via V22 extends above and below the overhanging structure.

As illustrated in FIG. 8A, the reinforcement patterns 51 and 53 are stacked on the lower surface of the insulation layer 32. Each reinforcement pattern 51 is connected to the reinforcement pattern 43 by one of the reinforcement vias V22. Each reinforcement pattern 51 is formed integrally with, for example, the reinforcement via V22.

The reinforcement patterns 53, 63, and 73, which have the same structure as the reinforcement patterns 43, the via holes VH23 to VH25, which have the same structure as the via holes VH22, and the reinforcement vias V23 to V25, which have the same structure as the reinforcement vias V22, will not be described in detail.

In the second embodiment, each recess 31Y is one example of a recess, each through hole 32Y is one example of a through hole, each via hole VH22 is one example of a via hole, each reinforcement via V22 is one example of a first reinforcement via, and each reinforcement via V23 is one example of a second reinforcement via. Further, each reinforcement pattern 43 is one example of a first reinforcement pattern, each reinforcement pattern 51 is one example of a second reinforcement pattern, each reinforcement pattern 53 is one example of a third reinforcement pattern, and each reinforcement pattern 61 is one example of a fourth reinforcement pattern.

Figure 10A:
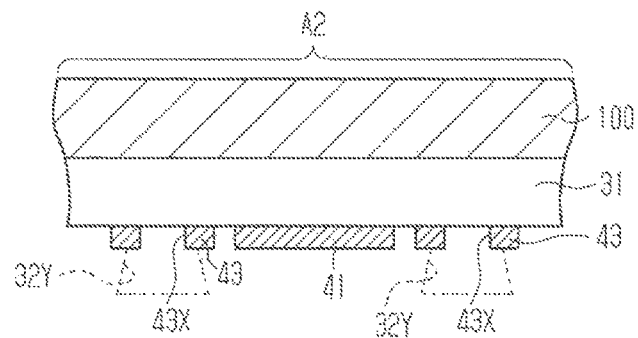
FIGS. 10A, 10C, and 10D are schematic cross-sectional views illustrating a method for manufacturing the wiring substrate of FIG. 8A.
Figure 10B:
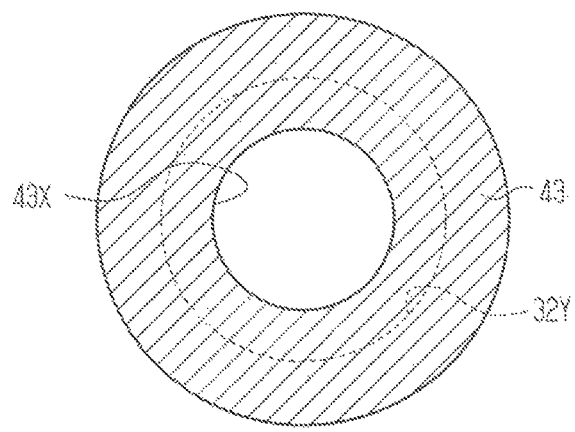
FIG. 10B is a schematic plan view illustrating a method for manufacturing the wiring substrate of FIG. 8A.
Figure 10C:
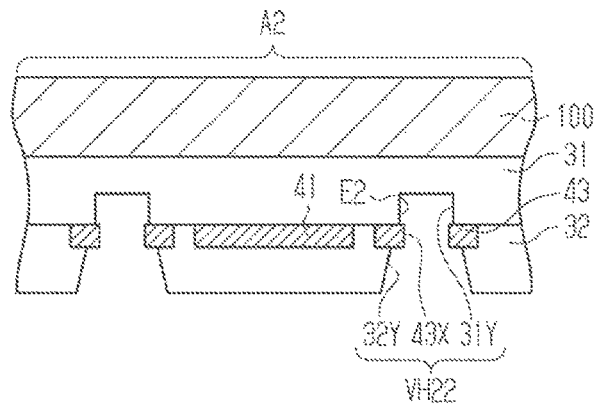
Figure 10D:
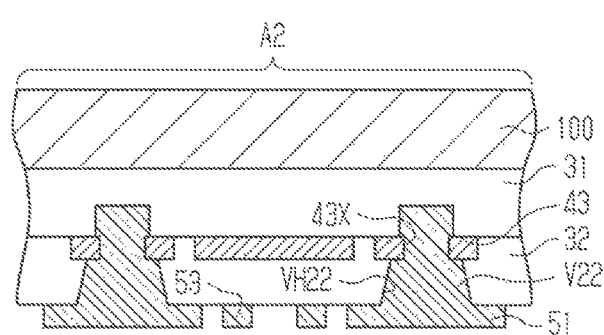

A method for manufacturing the wiring substrate 10A will now be described with reference to FIGS. 10A to 10D. Here, a method for manufacturing the reinforcement patterns 43, the reinforcement vias V22, and the reinforcement patterns 51 will be described. FIGS. 10A, 10C, and 10D are partial, enlarged views illustrating the peripheral region A2 of the wiring substrate 10A.

In the step illustrated in FIG. 10A, the reinforcement patterns 41 and 43 are formed on the lower surface of the insulation layer 31 that is stacked on the lower surface of the support substrate 100 through the steps of FIGS. 4A to 5A. As illustrated in FIG. 10B, each reinforcement pattern 43 is annular in a plan view and has an outer diameter that is larger than the diameter of the top of the corresponding through hole 32Y (upper open end of through hole 32Y in FIG. 10C). Further, the central portion of the reinforcement pattern 43 includes the bore 43X that has a smaller diameter than the top of the through hole 32Y in a plan view.

In the step illustrated in FIG. 10C, like in the step of FIG. 5B, the insulation layer 32 is formed on the lower surface of the insulation layer 31 to cover the reinforcement patterns 41 and 43. Then, laser processing is performed to form the via holes VH22 in the insulation layer 32 at the peripheral region A2. Each via hole VH22 includes the through hole 32Y, the bore 43X, and the recess 31Y that are in communication with one another. The through hole 32Y partially exposes the lower surface of the reinforcement pattern 43. The diameter of the top of the through hole 32Y is set to be smaller than the outer diameter of the reinforcement pattern 43 and larger than the diameter of the bore 43X. Thus, when the through hole 32Y is formed, a laser beam is emitted to the lower surface of the insulation layer 31 exposed in the bore 43X. The laser beam removes a portion (reduces thickness) of the insulation layer 31 from the lower surface thereof exposed in the bore 43X. Consequently, the recess 31Y is formed in the lower surface of the insulation layer 31 exposed in the bore 43X, and the via hole VH22 is formed including the recess 31Y, the bore 43X, and the through hole 32Y. Then, a desmearing process is performed to remove resin smears from the exposed surface of the reinforcement pattern 43 in the via hole VH22. The desmearing process removes resin smears and etches the insulation layer 31 exposed in the recess 31Y. This forms the wall E2 (portion of insulation layer 31) in the recess 31Y at the outer side of the wall surface of the bore 43X in a plan view. As a result, the inner circumferential portion of the reinforcement pattern 43 projects into the via hole VH22. Further, the inner circumference of the upper surface of the reinforcement pattern 43 is exposed in the recess 31Y, and the inner circumference of the lower surface of the reinforcement pattern 43 is exposed in the through hole 32Y.

In the step illustrated in FIG. 10D, like in the step of FIG. 5D, each via hole VH22 is filled with a via conductor to form the reinforcement via V22. The reinforcement via V22 entirely covers the surfaces of the corresponding reinforcement pattern 43, which projects into the via hole VH22. Further, the reinforcement patterns 51 are stacked on the lower surface of the insulation layer 32 so that the corresponding reinforcement vias V22 connect the reinforcement patterns 43 to the reinforcement patterns 51. The reinforcement patterns 43, the reinforcement vias V22, and the reinforcement patterns 51 are manufactured through the steps described above.

The second embodiment has the same advantages as the first embodiment.

Third Embodiment

Figure 11A:
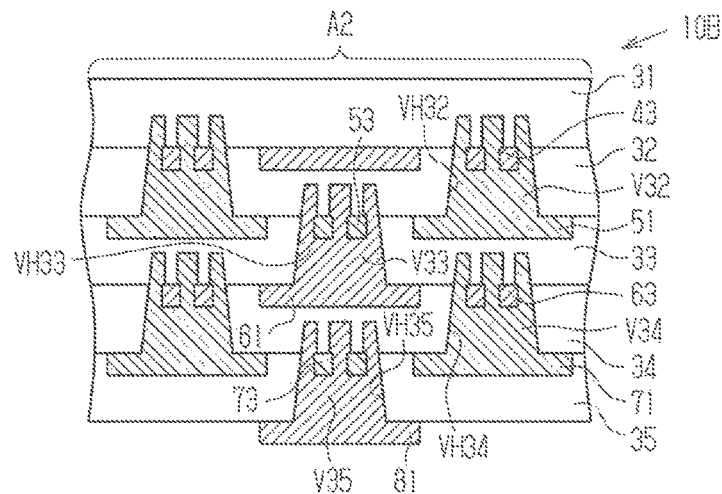
FIG. 11A is a schematic cross-sectional view illustrating a portion of a wiring substrate in a third embodiment.
Figure 11B:
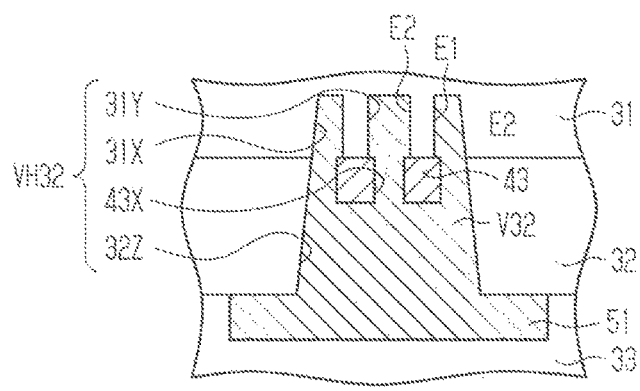
FIG. 11B is a partial, enlarged cross-sectional view of the wiring substrate illustrated in FIG. 11A.

A third embodiment will now be described with reference to FIGS. 11A to 12. A wiring substrate 10B of the third embodiment differs from the wiring substrate 10A of the second embodiment in the structure of the reinforcement vias. The description hereafter will focus on the differences from the second embodiment. FIGS. 11A and 11B are enlarged cross-sectional views illustrating the structure of the portion (peripheral region A2) that differs from the second embodiment. The solder resist layer 36 is not illustrated in FIGS. 11A and 11B. Same reference numerals are given to those components that are the same as the corresponding components illustrated in FIGS. 1A to 10D. Such components will not be described in detail.

As illustrated in FIG. 11A, the wiring substrate 10B in the peripheral region A2 includes via holes VH32, VH33, VH34, and VH35 and reinforcement vias V32, V33, V34, and V35 in lieu of the via holes VH22, VH23, VH24, and VH25 and the reinforcement vias V22, V23, V24, and V25, which are illustrated in FIG. 8A.

The via holes VH32 extend through the insulation layer 32 in the thickness-wise direction and expose the entire lower surfaces and the entire side surfaces of the corresponding reinforcement patterns 43. Each via hole VH32 extends through the insulation layer 32 in the thickness-wise direction and reduces the thickness of a portion of the insulation layer 31 formed directly on the insulation layer 32.

As illustrated in FIG. 11B, each via hole VH32 includes a through hole 32Z, which extends through the insulation layer 32 in the thickness-wise direction, and the bore 43X of the reinforcement pattern 43. Further, the via hole VH32 includes the recess 31X, which is formed in the lower surface of the insulation layer 31 around the reinforcement pattern 43, and the recess 31Y, which is formed in the lower surface of the insulation layer 31 exposed in the bore 43X. The through hole 32Z, the bore 43X, the recess 31X, and the recess 31Y are in communication with one another.

The through hole 32Z is partially overlapped with the reinforcement pattern 43 in a plan view. The through hole 32Z is larger than the reinforcement pattern 43 in a plan view and exposes the entire lower surface and the entire side surface of the reinforcement pattern 43.

Figure 12:
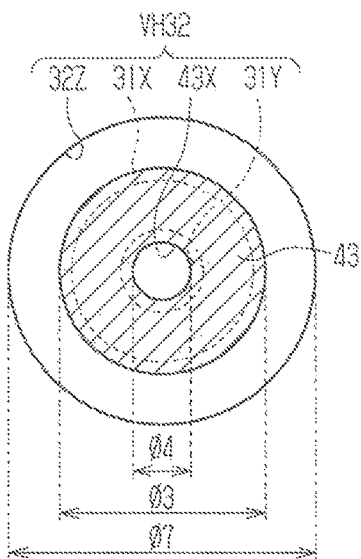
FIG. 12 is a schematic plan view illustrating a reinforcement pattern and a via hole in the third embodiment.

As illustrated in FIG. 12, the top of the through hole 32Z (upper open end of through hole 32Z in FIG. 11B) is, for example, circular in a plan view and larger than the outer shape of the corresponding reinforcement pattern 43 in a plan view. In the present example, the top of the through hole 32Z has a diameter Φ7 that is larger than the diameter Φ4 of the bore 43X and larger than the outer diameter Φ3 of the reinforcement pattern 43. As illustrated in FIG. 11B, the through hole 32Z is in communication with the bore 43X. Further, the entire lower surface and the entire outer surface of the reinforcement pattern 43 is exposed in the through hole 32Z, and the entire inner surface of the reinforcement pattern 43 is exposed in the bore 43X.

The recess 31X is in communication with the through hole 32Z. The recess 31X has the same structure as the recess 31X of the first embodiment. The recess 31X is formed by reducing the thickness of the insulation layer 31 covering the upper surface of the reinforcement pattern 43 to expose a portion (outer circumference) of the upper surface of the reinforcement pattern 43. The recess 31X includes the wall E1, which is located at the inner side of the outer surface of the reinforcement pattern 43 in a plan view.

The recess 31Y is in communication with the through hole 32Z and the bore 43X. The recess 31Y has the same structure as the recess 31Y of the second embodiment. The recess 31Y is formed by reducing the thickness of the insulation layer 31 covering the upper surface of the reinforcement pattern 43 to expose a portion (inner circumference) of the upper surface of the reinforcement pattern 43. The recess 31Y includes the wall E2, which is located at the outer side of the inner surface of the reinforcement pattern 43 (bore 43X) in a plan view.

The reinforcement via V32 is formed in the via hole VH32. The through hole 32Z, the bore 43X, and the recesses 31X and 31Y are filled with the reinforcement via V32. Since the recess 31X is filled with the reinforcement via V32, the outer circumferential portion of the top of the reinforcement via V32 (upper end of reinforcement via V32 in FIG. 11B) extends into the insulation layer 31. Further, since the recess 31Y is filled with the reinforcement via V32, the central portion of the top of the reinforcement via V32 extends into the insulation layer 31. The reinforcement via V32 directly contacts and covers the entire surface of the reinforcement pattern 43 exposed in the via hole VH32. In the present example, the reinforcement via V32 covers the entire lower surface and the entire outer surface of the reinforcement pattern 43 in the through hole 32Z and covers the entire inner surface of the reinforcement pattern 43 in the bore 43X. Further, the reinforcement via V32 covers the outer circumference of the upper surface of the reinforcement pattern 43 in the recess 31X and covers the inner circumference of the upper surface of the reinforcement pattern 43 in the recess 31Y. In this manner, in the present example, the inner circumferential portion of the reinforcement pattern 43 projects inwardly from the wall E2 of the recess 31Y in a plan view to form an inner overhanging structure, and the outer circumferential portion of the reinforcement pattern 43 projects outwardly from the wall E1 of the recess 31X in a plan view to form an outer overhanging structure. Then, the reinforcement via V32 extends above the inner overhanging structure and above the outer overhanging structure.

As illustrated in FIG. 11A, the reinforcement patterns 51 and 53 are stacked on the lower surface of the insulation layer 32. Each reinforcement pattern 51 is connected to the corresponding reinforcement pattern 43 by one of the reinforcement vias V32. Each reinforcement pattern 51 is, for example, formed integrally with the reinforcement via V32.

The via holes VH33 to VH35, which have the same structure as the via holes VH32, and the reinforcement vias V33 to V35, which have the same structure as the reinforcement vias V32, will not be described in detail.

The third embodiment has the same advantages as the first embodiment.

In the third embodiment, each recess 31X is one example of a first recess, each recess 31Y is one example of a second recess, each through hole 32Z is one example of a through hole, each via hole VH32 is one example of a via hole, each reinforcement via V32 is one example of a first reinforcement via, and each reinforcement via V33 is one example of a second reinforcement via.

It should be apparent to those skilled in the art that the foregoing embodiments may be employed in many other specific forms without departing from the spirit or scope of this disclosure. Particularly, it should be understood that the foregoing embodiments may be employed in the following forms.

In the above embodiments, the recesses 31X and 31Y are formed to partially expose the upper surfaces of the reinforcement patterns 42 and 43 in the wiring substrates 10, 10A, and 10B. In the wiring substrates 10 and 10B, each recess 31X includes the wall E1 located at the inner side of the side surface (outer surface) of the corresponding reinforcement pattern 42 in a plan view. In the wiring substrates 10A and 10B, each recess 31Y includes the wall E2 located at the outer side of the inner surface of the corresponding reinforcement pattern 43 (bore 43X) in a plan view. Instead, for example, the wall E1 of the recess 31X may be generally flush with the side surface (outer surface) of the corresponding reinforcement pattern 42. Further, the wall E2 of the recess 31Y may be generally flush with the inner surface of the corresponding reinforcement pattern 43 (bore 43X).

In the above embodiments, a solder resist layer may be formed on the upper surface of the insulation layer 31 in each of the wiring substrates 10, 10A, and 10B. The solder resist layer includes openings that expose the upper surface of the wiring layer 21 as the connection pads P1.

In the wiring substrates 10, 10A, and 10B of the above embodiments, the surface on which the connection pads P1 are formed defines a chip mounting surface, and the surface on which the external connection pads P2 are formed defines an external connection terminal surface. However, the chip mounting surface and the external connection terminal surface may be reversed.

Figure 13:
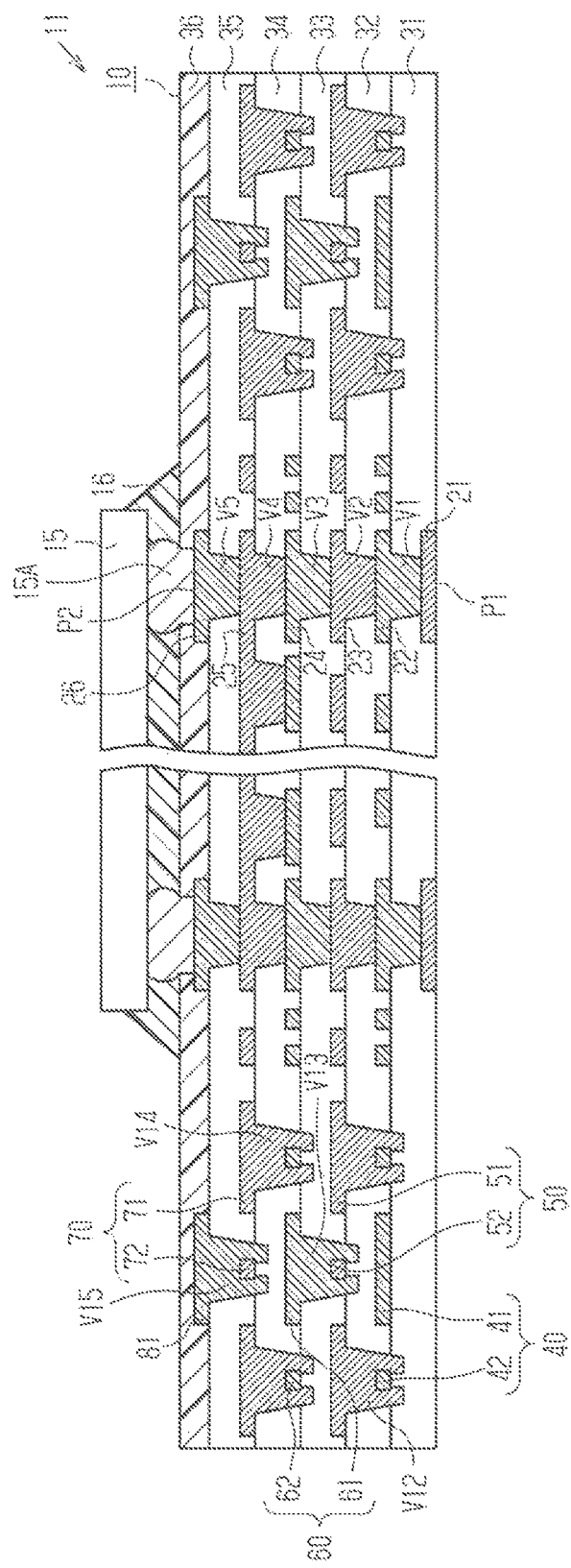
FIGS. 13 and 14 are schematic cross-sectional views illustrating various modified examples of the semiconductor device.

For example, as illustrated in FIG. 13, the chip mounting surface may be defined by the surface of the wiring substrate 10 on which the external connection pads P2 are formed, and the bumps 15A of the semiconductor chip 15 may be flip-chip-bonded to the external connection pads P2. In this case, the surface of the wiring substrate 10 on which the connection pads P1 are formed defines the external connection terminal surface.

In the above embodiments, the wiring substrates 10, 10A, and 10B are coreless wiring substrates. Instead, for example, the wiring substrates 10, 10A, and 10B may each be a buildup wiring substrate that includes a core substrate. An example of a buildup wiring substrate will now be described.

Figure 14:
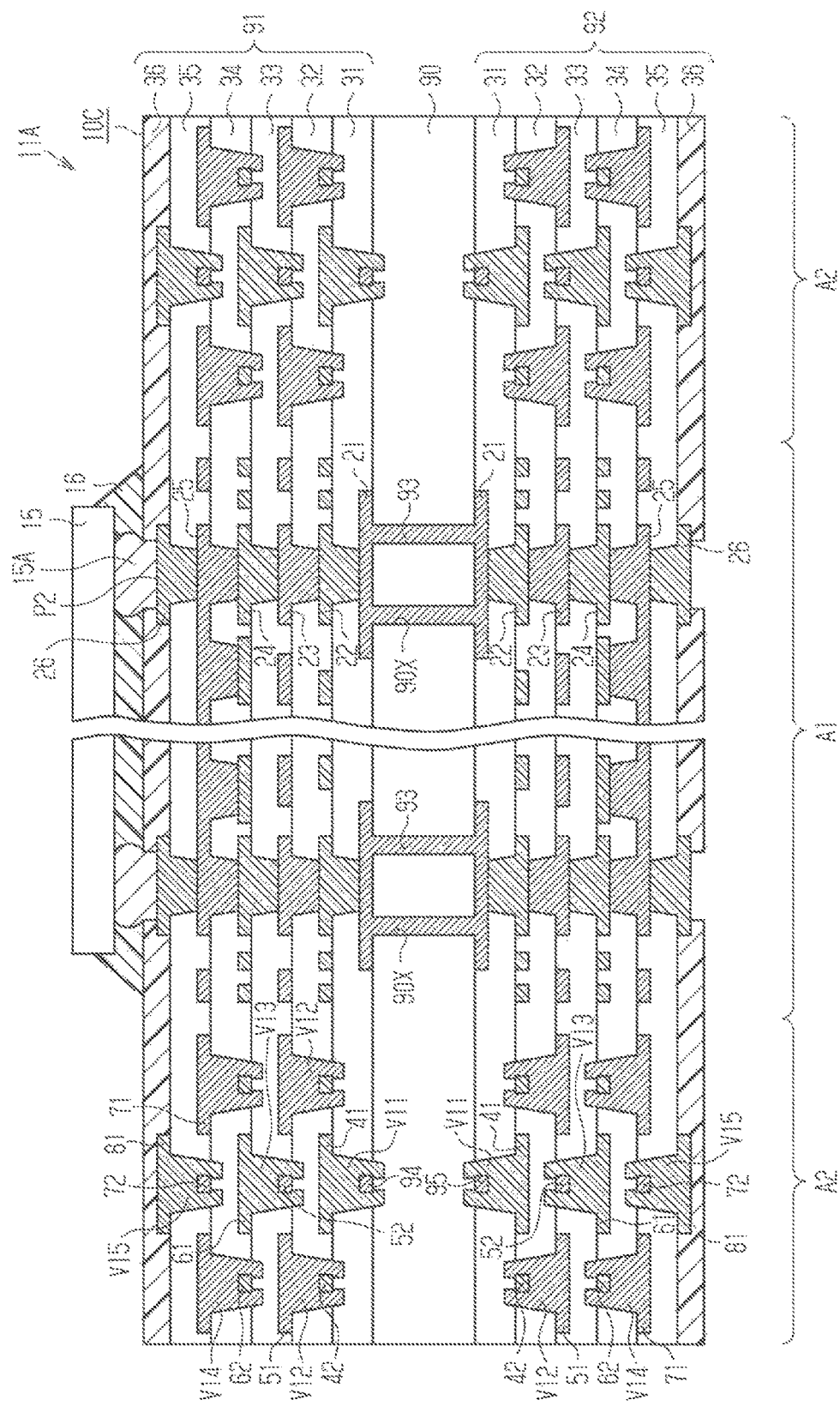

For example, as illustrated in FIG. 14, a wiring substrate 10C includes a core substrate 90, a wiring structure 91 stacked on the upper surface of the core substrate 90, and a wiring structure 92 stacked on the lower surface of the core substrate 90. The core substrate 90 may be a glass epoxy substrate formed by impregnating a glass cloth (glass fabric), which is reinforcement material, with thermosetting insulative resin, the main component of which is epoxy resin, and hardening the insulative resin. The reinforcement material is not limited to glass cloth and may be, for example, a non-woven glass fabric, an aramid fabric, a non-woven aramid fabric, an LCP fabric, or a non-woven LCP fabric. Further, the thermosetting insulative resin is not limited to epoxy resin and may be, for example, a resin material such as polyimide resin or cyanate resin. The core substrate 90 is thicker than other insulation layers. The core substrate 90 may have a thickness of, for example, approximately 40 to 400 μm.

Through holes 90X extend through the core substrate 90 at given locations (two locations in FIG. 14). A through electrode 93 is formed in each through hole 90X. The through electrode 93 is, for example, through hole plating that covers the wall surface of the through hole 90X. In the through hole 90X, the inner side of the through electrode 93 is filled with resin. Instead of the combination of through hole plating and resin, a plating conductor may be solely used. In this case, each through hole 90X is filled with the plating conductor to form the through electrode 93.

The wiring structures 91 and 92 have the same structure as the wiring substrate 10 (refer to FIG. 1A) of the first embodiment. Thus, same reference numerals are given to those components that are the same as the corresponding components illustrated in FIGS. 1A to 7B. Such components will not be described in detail.

The wiring structure 91 includes the wiring layer 21, which is electrically connected to the through electrodes 93, the insulation layer 31, the wiring layer 22, the insulation layer 32, the wiring layer 23, the insulation layer 33, the wiring layer 24, the insulation layer 34, the wiring layer 25, the insulation layer 35, the wiring layer 26, and the solder resist layer 36 that are sequentially stacked on the upper surface of the core substrate 90. In the same manner, the wiring structure 92 includes the wiring layer 21, which is electrically connected to the through electrodes 93, the insulation layer 31, the wiring layer 22, the insulation layer 32, the wiring layer 23, the insulation layer 33, the wiring layer 24, the insulation layer 34, the wiring layer 25, the insulation layer 35, the wiring layer 26, and the solder resist layer 36 that are sequentially stacked on the lower surface of the core substrate 90.

In the same manner as the wiring substrate 10, the peripheral region A2 of each of the wiring structures 91 and 92 each include the reinforcement patterns 41, 42, 51, 52, 61, 62, 71, 72, and 81 and the reinforcement vias V12 to V15. Further, the peripheral region A2 of the wiring structure 91 includes reinforcement patterns 94, which are stacked in the upper surface of the core substrate 90, and reinforcement vias V11, which extend through the insulation layer 31 in the thickness-wise direction. In the wiring substrate 91, the outer circumferential portion of the bottom of each reinforcement via V11 extends into the core substrate 90 from the upper surface of the core substrate 90. The reinforcement vias V11 have the same structure as the reinforcement vias V12. Each reinforcement via V11 is formed integrally with the corresponding reinforcement pattern 41 and covers the entire upper surface, the entire side surface, and the outer circumference of the lower surface of the reinforcement pattern 94. In the same manner, the peripheral region A2 of the wiring structure 92 includes reinforcement patterns 95, which are stacked in the lower surface of the core substrate 90, and reinforcement vias V11, which extend through the insulation layer 31 in the thickness-wise direction. In the wiring substrate 92, the outer circumferential portion of the top of each reinforcement via V11 extends into the core substrate 90 from the lower surface of the core substrate 90.

The wiring substrate 10C with the structure described above has advantages (1) to (7) of the first embodiment. A modified example of the wiring substrate 10 has been described here. The same may be applied to the wiring substrates 10A and 10B.

As illustrated in FIG. 14, the semiconductor device 11A is manufactured by flip-chip-bonding the bumps 15A of the semiconductor chip 15 to the external connection pads P2 formed on the wiring structure 91 of the wiring substrate 10C. In the semiconductor device 11A, the gap between the semiconductor chip 15 and the solder resist layer 36 of the wiring structure 91 is filled with the underfill resin 16.

Each of the above embodiments is exemplified by a method that manufactures a single product but may be applied to a method that manufactures products in batches.

As illustrated in FIG. 15A, the above embodiments may each be applied to a sheet of a wiring substrate 10D including a plurality of wiring substrates 10. The wiring substrate 10D is, for example, rectangular in a plan view. The wiring substrate 10D includes a plurality of (here, two) blocks 110 and an outer frame 120 entirely surrounding the blocks 110. The two blocks 110 are separated from each other. Each block 110 includes a plurality of wiring substrates 10 in a matrix array (here, 4×4). The wiring substrate 10D is ultimately cut apart and fragmented into individual wiring substrates 10. The wiring substrates 10 may be spaced apart from one another by a given interval as illustrated in FIG. 15A or be arranged in contact with one another. The outer frame 120 is disposed of after the wiring substrate 10D is cut apart.

In the same manner as the first embodiment, the peripheral region A2 of each wiring substrate 10 in the wiring substrate 10D includes the reinforcement patterns 41, 42, 51, 52, 61, 62, 71, 72, and 81 and the reinforcement vias V12 to V15 (hereafter, collectively referred to as the reinforcement structures 130") illustrated in FIG. 1A.

In the same manner as each wiring substrate 10, the outer frame 120 includes a stack of the insulation layers 31 to 35. The outer frame 120 includes a plurality of (here, four) through holes 120X. Each through hole 120X extends through the insulation layers 31 to 35 of the outer frame 120 in the thickness-wise direction. The through holes 120X may be, for example, used to position the wiring substrate 10D or transport the wiring substrate 10D.

Further, the peripheral portion of the outer frame 120 includes, for example, reinforcement structures 130 that extend along each side of the wiring substrate 10D. Additionally, as illustrated in FIG. 15B, the reinforcement structures 130 are also formed around each through hole 120X.

In this manner, the concentrated arrangement of the reinforcement structures 130 in the peripheral portion of the outer frame 120 and around the through holes 120X limits damages such as cracking of the outer frame 120 during the manufacturing process.

In the above modified example, the wiring substrate 10D includes a plurality of the wiring substrates 10 but may instead include a plurality of wiring substrates 10A, a plurality of wiring substrates 10B, or a plurality of wiring substrates 10C.

In the wiring substrate 10D of the above modified example, the reinforcement structures 130 may be omitted from each of the wiring substrates 10 and 10A to 10C. That is, the reinforcement structures 130 may be formed in only the outer frame 120 of the wiring substrate 10D.

In the wiring substrates 10 and 10A to 10C of the above embodiments, only the peripheral region A2 includes the reinforcement structures 130 (reinforcement patterns 41, 42, 51, 52, 61, 62, 71, 72, and 81 and reinforcement vias V12 to V15). In addition, the reinforcement structures 130 may be arranged at locations where the wiring layers 21 to 26 are not located in the wiring formation region A1 of the wiring substrates 10 and 10A to 10C.

In each of the above embodiments, the locations of the reinforcement patterns 40, 50, 60, 70, and 81 and the reinforcement vias V12 to V15, V22 to V25, and V32 to V35 are not particularly limited in a plan view.

In the wiring substrates 10 and 10A to 10C of the above embodiments, each of the reinforcement vias V12 to V15, V22 to V25, and V32 to V35 is formed independently on the same plane. That is, the adjacent ones of the reinforcement vias V12 to V15, V22 to V25, and V32 to V35 are arranged separately. Instead, for example, some of the reinforcement vias V12 to V15 may be connected to the adjacent vias V12 to V15 by the reinforcement patterns 51, 61, 71, 81, or the like.

In the wiring substrates 10 and 10A to 10C of the above embodiments, for each of the insulation layers 31 to 35, the reinforcement patterns and the reinforcement vias do not have to be formed. For example, the reinforcement patterns 81, 71, 72, and 62 and the reinforcement vias V15 and V14 may be omitted from the wiring substrate 10.

In the wiring substrates 10 and 10A to 10C of the above embodiments, the reinforcement patterns 41 may be omitted.

In the wiring substrates 10 and 10A to 10C of the above embodiments, the solder resist layer 36 may be omitted.

In the wiring substrates 10 and 10A to 10C of the above embodiments, the number of the wiring layers 21 to 26 and the insulation layers 31 to 35 and the layout of the wiring pattern in the wiring layers 21 to 26 may be changed.

In the above embodiments, the semiconductor chip 15 is mounted on each of the wiring substrates 10 and 10A to 10C. However, the mounted subject is not limited to the semiconductor chip 15. For example, the above embodiments may be applied to a package-on-package having a structure in which a further wiring substrate is stacked on each of the wiring substrates 10 and 10A to 10C.

In the above embodiments, the number of the semiconductor chips mounted on the wiring substrates 10 and 10A to 10C may be changed. Further, the mounting mode of the semiconductor chip (e.g., flip-chip-mounting, wire bonding, or a combination of flip-chip-mounting and wire bonding) may be changed.

The present examples and embodiments are to be considered as illustrative and not restrictive, and the invention is not to be limited to the details given herein, but may be modified within the scope and equivalence of the appended claims.

CLAUSE

This disclosure encompasses the following embodiments.

1. A method for manufacturing a wiring substrate, the method including:
stacking a first wiring layer on a lower surface of a first insulation layer in a wiring formation region;
stacking a first reinforcement pattern on the lower surface of the first insulation layer in a peripheral region located at an outer side of the wiring formation region;
stacking a second insulation layer on the lower surface of the first insulation layer to cover the first wiring layer and the first reinforcement pattern;
forming a via hole including
forming a through hole that extends through the second insulation layer in a thickness-wise direction to expose the first reinforcement pattern, and
forming a recess that is in communication with the through hole in the lower surface of the first insulation layer so that the through hole and the recess form the via hole;
filling the via hole with a via conductor to form a first reinforcement via that is in contact with the first reinforcement pattern, wherein the first reinforcement via includes a top that partially extends into the first insulation layer; and
stacking a second reinforcement pattern on a lower surface of the second insulation layer, wherein the second reinforcement pattern is connected to the first reinforcement pattern by the first reinforcement via.

The invention claimed is:

1. A wiring substrate comprising:
a first insulation layer;
a first wiring layer stacked on a lower surface of the first insulation layer;
a first reinforcement pattern stacked on the lower surface of the first insulation layer at a peripheral region located at an outer side of a wiring formation region where the first wiring layer is formed;
a second insulation layer stacked on the lower surface of the first insulation layer to cover the first wiring layer;
a first reinforcement via conductor that extends through the second insulation layer in a thickness-wise direction and contacts the first reinforcement pattern; and
a second reinforcement pattern stacked on a lower surface of the second insulation layer and connected to the first reinforcement pattern by the first reinforcement via conductor,
wherein the first reinforcement via conductor includes a top that partially extends into and contacts the first insulation layer.

2. The wiring substrate according to claim 1, further comprising:
a via hole filled with the first reinforcement via conductor, wherein the via hole includes
a through hole that extends through the second insulation layer in the thickness-wise direction, wherein the through hole includes a top that is larger than the first reinforcement pattern in a plan view, and
a recess formed in the lower surface of the first insulation layer in communication with the through hole at a location surrounding an outer circumferential portion of the first reinforcement pattern in a plan view;
wherein the first reinforcement via conductor entirely covers a lower surface and a side surface of the first reinforcement pattern, and
the top of the first reinforcement via conductor includes an outer circumferential portion that extends into and contacts the first insulation layer.

3. The wiring substrate according to claim 2, wherein
the recess exposes an outer circumferential portion of an upper surface of the first reinforcement pattern, and
the first reinforcement via conductor further covers the outer circumferential portion of the upper surface of the first reinforcement pattern in the recess.

4. The wiring substrate according to claim 1, wherein:
the first reinforcement pattern is ring-shaped and includes a bore located at a central portion of the first reinforcement pattern in a plan view;
the wiring substrate further comprises a via hole filled with the first reinforcement via conductor;
the via hole includes
a through hole that extends through the second insulation layer in the thickness-wise direction, wherein the through hole includes a top that is smaller than an outer shape of the first reinforcement pattern and larger than the bore of the first reinforcement pattern in a plan view,
the bore of the first reinforcement pattern that is in communication with the through hole, and
a recess formed in the lower surface of the first insulation layer in communication with the bore of the first reinforcement pattern;
the first reinforcement via conductor covers an inner circumferential portion of a lower surface of the first reinforcement pattern in the through hole and entirely covers an inner surface of the first reinforcement pattern in the bore; and
the top of the first reinforcement via conductor includes a central portion that extends into and contacts the first insulation layer.

5. The wiring substrate according to claim 4, wherein
the recess exposes an inner circumferential portion of an upper surface of the first reinforcement pattern, and
the first reinforcement via conductor further covers the inner circumferential portion of the upper surface of the first reinforcement pattern in the recess.

6. The wiring substrate according to claim 1, wherein:
the first reinforcement pattern is ring-shaped and includes a bore located at a central portion of the first reinforcement pattern in a plan view;
the wiring substrate further comprises a via hole filled with the first reinforcement via conductor;
the via hole includes
a through hole that extends through the second insulation layer in the thickness-wise direction, wherein the through hole includes a top that is larger than an outer shape of the first reinforcement pattern in a plan view,
the bore of the first reinforcement pattern that is in communication with the through hole,
a first recess formed in the lower surface of the first insulation layer in communication with the through hole at a location surrounding an outer circumferential portion of the first reinforcement pattern in a plan view, and
a second recess formed in the lower surface of the first insulation layer in communication with the bore of the first reinforcement pattern;
the first reinforcement via conductor entirely covers a lower surface and an outer surface of the first reinforcement pattern in the through hole and entirely covers an inner surface of the first reinforcement pattern in the bore; and
the top of the first reinforcement via conductor includes an outer circumferential portion and a central portion that extend into and contact the first insulation layer.

7. The wiring substrate according to claim 6, wherein
the first recess exposes an outer circumferential portion of an upper surface of the first reinforcement pattern,
the second recess exposes an inner circumferential portion of the upper surface of the first reinforcement pattern, and the first reinforcement via conductor further covers the outer circumferential portion of the upper surface of the first reinforcement pattern in the first recess and covers the inner circumferential portion of the upper surface of the first reinforcement pattern in the second recess.

8. The wiring substrate according to claim 1, wherein the first reinforcement pattern and the second reinforcement pattern each include a pad connected to the first reinforcement via conductor.

9. The wiring substrate according to claim 1, further comprising:
a second wiring layer stacked on the lower surface of the second insulation layer;
a third reinforcement pattern stacked on the lower surface of the second insulation layer at a location separated from the second reinforcement pattern;
a third insulation layer stacked on the lower surface of the second insulation layer to cover the second wiring layer and the second reinforcement pattern;
a second reinforcement via conductor that extends through the third insulation layer in the thickness-wise direction, wherein the second reinforcement via conductor contacts and covers a lower surface and a side surface of the third reinforcement pattern; and
a fourth reinforcement pattern stacked on a lower surface of the third insulation layer and connected to the third reinforcement pattern by the second reinforcement via conductor, wherein
the second reinforcement via conductor includes a top that partially extends into and contacts the second insulation layer, and
the first reinforcement via conductor and the second reinforcement via conductor are located at non-overlapping positions in a plan view.

10. A semiconductor device comprising:
the wiring substrate according to claim 1; and
a semiconductor chip mounted on the wiring formation region of the wiring substrate.

11. A wiring substrate comprising:
a first insulation layer;
a first wiring layer stacked on a lower surface of the first insulation layer;
a first reinforcement pattern stacked on the lower surface of the first insulation layer at a peripheral region located at an outer side of a wiring formation region where the first wiring layer is formed;
a second insulation layer stacked on the lower surface of the first insulation layer to cover the first wiring layer;
a first reinforcement via that extends through the second insulation layer in a thickness-wise direction and contacts the first reinforcement pattern, the first reinforcement via including a top that partially extends into the first insulation layer;
a second reinforcement pattern stacked on a lower surface of the second insulation layer and connected to the first reinforcement pattern by the first reinforcement via; and
a via hole filled with the first reinforcement via, the via hole including:
a through hole that extends through the second insulation layer in the thickness-wise direction, wherein the through hole includes a top that is larger than the first reinforcement pattern in a plan view, and
a first recess formed in the lower surface of the first insulation layer in communication with the through hole at a location surrounding an outer circumferential portion of the first reinforcement pattern in a plan view;
wherein the first reinforcement via entirely covers a lower surface and a side surface of the first reinforcement pattern, and
the top of the first reinforcement via includes an outer circumferential portion that extends into the first insulation layer.

12. The wiring substrate according to claim 11, wherein the first recess exposes an outer circumferential portion of an upper surface of the first reinforcement pattern, and
the first reinforcement via further covers the outer circumferential portion of the upper surface of the first reinforcement pattern in the first recess.

13. The wiring substrate according to claim 11, wherein:
the first reinforcement pattern is ring-shaped and includes a bore located at a central portion of the first reinforcement pattern in a plan view, the bore being in communication with the through hole;
the through hole top is larger than an outer shape of the first reinforcement pattern in a plan view;
a second recess is formed in the lower surface of the first insulation layer in communication with the bore of the first reinforcement pattern;
the first reinforcement via entirely covers a lower surface and an outer surface of the first reinforcement pattern in the through hole and entirely covers an inner surface of the first reinforcement pattern in the bore; and
the top of the first reinforcement via further includes a central portion that extends into the first insulation layer.

14. The wiring substrate according to claim 13, wherein the first recess exposes an outer circumferential portion of an upper surface of the first reinforcement pattern,
the second recess exposes an inner circumferential portion of the upper surface of the first reinforcement pattern, and
the first reinforcement via further covers the outer circumferential portion of the upper surface of the first reinforcement pattern in the first recess and covers the inner circumferential portion of the upper surface of the first reinforcement pattern in the second recess.

15. The wiring substrate according to claim 11, wherein the first reinforcement pattern and the second reinforcement pattern each include a pad connected to the first reinforcement via.

16. The wiring substrate according to claim 11, further comprising:
a second wiring layer stacked on the lower surface of the second insulation layer;
a third reinforcement pattern stacked on the lower surface of the second insulation layer at a location separated from the second reinforcement pattern;
a third insulation layer stacked on the lower surface of the second insulation layer to cover the second wiring layer and the second reinforcement pattern;
a second reinforcement via that extends through the third insulation layer in the thickness-wise direction, wherein the second reinforcement via contacts and covers a lower surface and a side surface of the third reinforcement pattern; and
a fourth reinforcement pattern stacked on a lower surface of the third insulation layer and connected to the third reinforcement pattern by the second reinforcement via, wherein the second reinforcement via includes a top that partially extends into the second insulation layer, and
the first reinforcement via and the second reinforcement via are located at non-overlapping positions in a plan view.

17. A semiconductor device comprising:
the wiring substrate according to claim 11; and
a semiconductor chip mounted on the wiring formation region of the wiring substrate.

18. A wiring substrate comprising:
a first insulation layer;
a first wiring layer stacked on a lower surface of the first insulation layer;
a ring-shaped first reinforcement pattern stacked on the lower surface of the first insulation layer at a peripheral region located at an outer side of a wiring formation region where the first wiring layer is formed, first reinforcement pattern including a bore located at a central portion of the first reinforcement pattern in a plan view;
a second insulation layer stacked on the lower surface of the first insulation layer to cover the first wiring layer;
a first reinforcement via that extends through the second insulation layer in a thickness-wise direction and contacts the first reinforcement pattern, the first reinforcement via including a top that partially extends into the first insulation layer;
a second reinforcement pattern stacked on a lower surface of the second insulation layer and connected to the first reinforcement pattern by the first reinforcement via; and
a via hole filled with the first reinforcement via, the via hole including:
a through hole that extends through the second insulation layer in the thickness-wise direction, wherein the through hole includes a top that is smaller than an outer shape of the first reinforcement pattern and larger than the bore of the first reinforcement pattern in a plan view,
the bore of the first reinforcement pattern that is in communication with the through hole, and
a recess formed in the lower surface of the first insulation layer in communication with the bore of the first reinforcement pattern;
wherein the first reinforcement via covers an inner circumferential portion of a lower surface of the first reinforcement pattern in the through hole and entirely covers an inner surface of the first reinforcement pattern in the bore; and
the top of the first reinforcement via includes a central portion that extends into the first insulation layer.

19. The wiring substrate according to claim 18, wherein the recess exposes an inner circumferential portion of an upper surface of the first reinforcement pattern, and
the first reinforcement via further covers the inner circumferential portion of the upper surface of the first reinforcement pattern in the recess.

20. A semiconductor device comprising:
the wiring substrate according to claim 18; and
a semiconductor chip mounted on the wiring formation region of the wiring substrate.

* * * * *